United States Patent [19]
Kishii et al.

[11] Patent Number: 5,837,390
[45] Date of Patent: Nov. 17, 1998

[54] METAL COMPLEX, METHOD FOR PRODUCING THE SAME AND OPTICAL DEVICE

[75] Inventors: Noriyuki Kishii, Kanagawa; Yasunori Kijima, Tokyo; Masafumi Ata, Kanagawa; Nobutoshi Asai, Kanagawa; Andrew Hudson, Kanagawa, all of Japan

[73] Assignee: Sony Corporation, Tokyo, Japan

[21] Appl. No.: 641,493

[22] Filed: May 1, 1996

[30] Foreign Application Priority Data

| May 10, 1995 | [JP] | Japan | ................................. 7-137306 |
| May 10, 1995 | [JP] | Japan | ................................. 7-137307 |
| May 12, 1995 | [JP] | Japan | ................................. 7-138618 |

[51] Int. Cl.$^6$ .................................................. B32B 4/00
[52] U.S. Cl. .................. 428/690; 428/917; 252/301.16; 313/504; 313/506
[58] Field of Search .................................. 428/457, 690, 428/917; 252/301.16, 301.17, 301.19, 301.21, 301.22, 301.23, 301.35; 313/501, 504, 506

[56] References Cited

U.S. PATENT DOCUMENTS

| 5,389,444 | 2/1995 | Hosokawa et al. ..................... 428/457 |
| 5,405,709 | 4/1995 | Littman et al. .......................... 428/690 |
| 5,466,392 | 11/1995 | Hironaka et al. .................. 252/301.16 |
| 5,484,922 | 1/1996 | Moore et al. ............................... 546/7 |
| 5,539,424 | 7/1996 | Hattori et al. ............................. 345/76 |

*Primary Examiner*—Elizabeth Evans
*Attorney, Agent, or Firm*—Hill & Simpson

[57] ABSTRACT

A novel bi-nuclear metal complex with greater luminescence and higher electron transfer potency and an optical device such as organic EL devices using therein the metal complex, are provided, together with a method for producing the novel complex at a higher efficiency. The complex containing specific ligands is represented by the following general formula:

General formula [I]:

$$M_2(L^1\text{-}O)_m(L^2\text{-}O)_n(L^3\text{-}O)_{3-m-n}X_p$$

(wherein M represents a divalent metal atom or Zn; $L^1$, $L^2$ and $L^3$ are ligands, individually different from each other;

X represents an anion;

"m" and "n" represent independently an integer of 0 to 3; and

"p" represents an integer of 0 to 4.).

26 Claims, 34 Drawing Sheets

F I G. 31
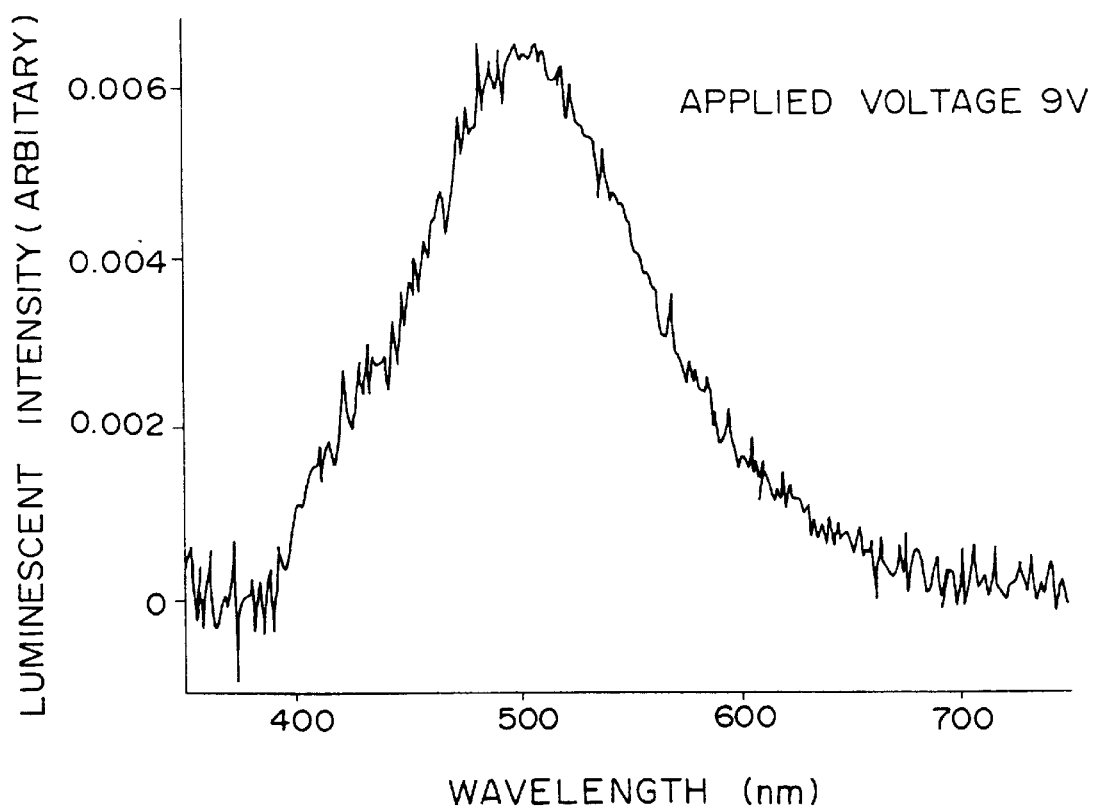

METAL COMPLEX, METHOD FOR PRODUCING THE SAME AND OPTICAL DEVICE

BACKGROUND OF THE INVENTION

1. Field of the Invention

The present invention relates to a novel bi-nuclear metal complex (more-specifically, to a novel metal complex preferable as optical electronic materials such as optical devices and the like), a method for producing the same and an optical device.

2. Description of the Related Art

Since a report has been issued from Kodak, Co. Ltd. in 1987 of an example of a luminescent device wherein an oxine complex is used as an organic luminescent substance (Appl. Phys. Lett., 51(12), Sept. 21, 1987), fundamental research works have been carried out vigorously for the purpose of applying such organic luminescent substances to displays and the like. A variety of metal complexes such as zinc complexes and aluminum complexes have been proposed as the materials with a high luminescent efficiency.

However, no organic device with electroluminescence (sometimes abbreviated as "EL" hereinafter) having both satisfactory luminescence and chromaticity has been developed yet, although organic EL devices have generally a relatively high luminescence. Therefore, it has been expected that a wide variety of organic luminescent substances will be developed so as to acquire the emission of far more colors from them.

OBJECT AND SUMMARY OF THE INVENTION

The present invention has been made in such circumstances. So as to prepare an optical device such as organic EL devices capable of emitting high luminescence at a variety of chromaticities, it is an object of the present invention to provide a novel material with high fluorescence of various chromaticities and with great electron transfer potency, and an optical device such as organic EL devices using the material.

It is a further objective of the present invention to provide a method for producing the novel material at a higher efficiency.

So as to attain the objectives described above, the present inventors have made investigations for a long term. Consequently, the inventors have found that a specific bi-nuclear metal complex having specific ligands has high luminescence and fluorescence of a variety of chromaticities and great electron transfer potency.

The present invention has been achieved on the basis of such findings. A first aspect of the present invention relates to a bi-nuclear metal complex of the following formula.

General formula [I]:

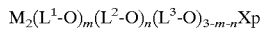

(wherein M represents a divalent metal atom or Zn; $L_1$, $L^2$ and $L^3$ are ligands, individually different from each other;

X represents an anion;

"m" and "n" represent independently an integer of 0 to 3; and

"p" represents an integer of 0 to 4.)

In the bi-nuclear metal complex of the first aspect of the present invention, M is an element of the periodic table 2A (namely, an alkali earth metal such as Be, Mg, Ca, Sr, Ba, and Ra) or an element of the table 2B (namely, Cd and Hg) or Zn; $L^1$, $L^2$ and $L^3$ each are a ligand derived from a compound having a hydroxyl group and an aromatic nitrogen atom (N) within the molecule and being represented by the following structural formula (A), wherein the hydrogen atom of the hydroxyl group is eliminated from the compound; and X is preferably a halogen atom (such as F, Cl, Br and I; the same is true hereinbelow), and an anion capable of pairing an alkoxyl group or a phenoxyl group or the like.

Structural formula (A):

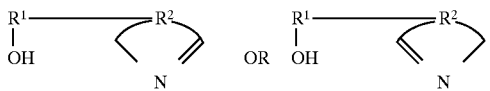

(wherein $R^1$ and $R^2$ are independently a group or an atomic group; $R^1$ may form a ring in cooperation with an atom adjacent to the aromatic nitrogen atom (N) and/or a part of $R^2$; $R^2$ together with the aromatic nitrogen atom (N) and/or an atom adjacent to the nitrogen atom forms a ring.)

In such case, the ligand $L^1$ may be o-hydroxyphenylbenzoxazole represented by the following structural formula (B) or a derivative thereof; and $L^2$ may be 8-hydroxyquinoline represented by the following structural formula (C) and a derivative thereof.

Structural formula (B):

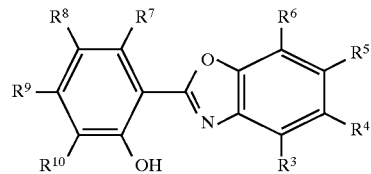

(wherein $R^3$, $R^4$, $R^5$, $R^6$, $R^7$, $R^8$, $R^9$ and $R^{10}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.)

Structural formula (C):

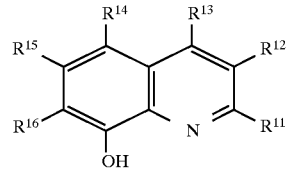

(wherein $R^{11}$, $R^{12}$, $R^{13}$, $R^{14}$, $R^{15}$, and $R^{16}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.)

The ligand $L^3$ may optionally be selected, including for example those derived from the compound represented by the following structural formula (D) (the same is true hereinbelow) (wherein $R^{24}$ to $R^{78}$ are the same as described for $R^3$ and $R^{10}$).

Structural formula (D):

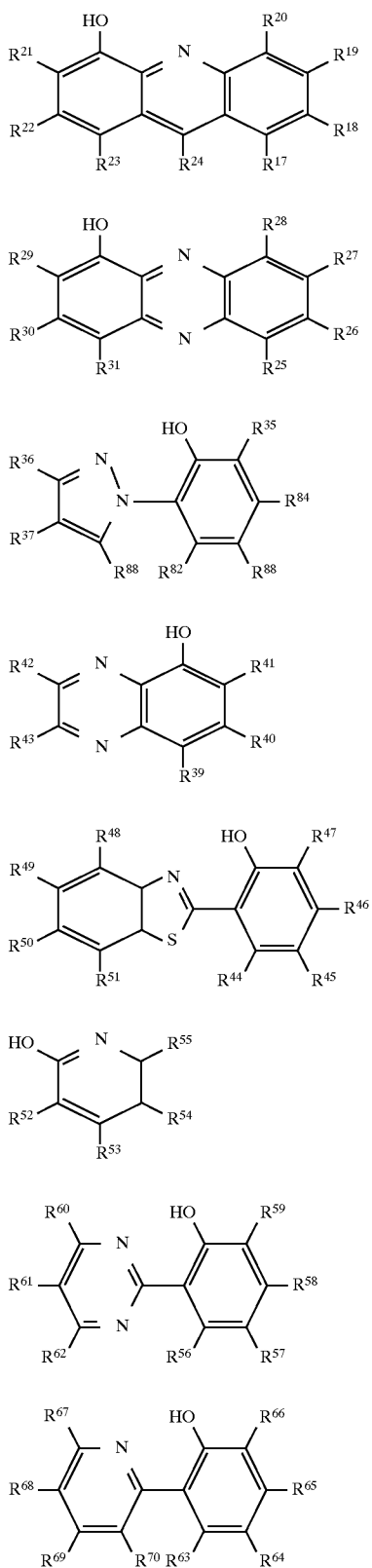

Structural formula (D):

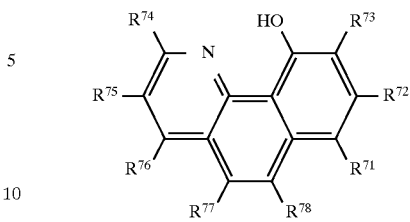

In the first aspect of the present invention (as in the second and third aspects of the present invention described below), the ligands $L^1$, $L^2$ and $L^3$ each may be derived from any compound containing a hydroxyl group and an aromatic nitrogen atom within the molecule and having a complexing potency with zinc and aluminium (generally for use in colorimetry) or these ligands may be any combination of such compounds, and the ligands are not limited to those of the structural formula (B) or (C), for example o-hydroxyphenylbenzoxazole or 8-hydroxyquinoline described below in examples. The ligands may be synthesized by mixing three different ligands together.

The bi-nuclear metal complex of the first aspect of the present invention is preferably produced according to a second aspect of the present invention.

More specifically, the second aspect of the present invention is a method for producing a bi-nuclear metal complex represented by the following general formula (I), comprising reacting in alcohol a metal salt represented by the following general formula (II) with a compound represented by the general formula (III).

General formula (II): $MnX'_2$ (wherein M represents a divalent metal atom or Zn; and X' represents an anion.)

General formula (III):

$L^1OH$, $L^2OH$, or $L^3OH$ (wherein $L^1$, $L^2$ and $L^3$ are different from each other and are the same as described above for those serving as ligands.)

General formula (I):

$M_2(L^1\text{-}O)_m(L^2\text{-}O)_n(L^3\text{-}O)_{3-m-n}Xp$ (wherein M, $L^1$, $L^2$ and $L^3$ are the same as described above;

X represents an anion;

"m" and "n" are an integer of 0 to 3; and

"p" represents an integer of 0 to 4.)

By the present method, the solvent alcohol can stabilize the double-nuclear complex of such divalent metal to recover an objective substance efficiently. As such alcohol, use may be made of a lower alcohol with one to 12 carbon atoms (C1 to C12). Such reaction solvent should be selected so that the yield of single-nuclear metal complexes as by-products might be the lowest from the respect of the solubilities of the metal salt and the ligand. Any alcohol such as methanol and propanol may be used, with no limitation to ethanol.

Preferably, such alcohol may be used at a weight ratio of 1 to 1,000 to the reaction substances. The reaction should be carried out at a temperature of about the boiling point of the alcohol.

In the examples described below, use is made of ethanol as the reaction solvent and zinc chloride as the metal salt. However, the metal salt should be selected from the respect of the solubility in the solvent, so it is not limited to chlorides.

So as to eliminate the hydrogen atom from the compound of the general formula (III) for preparing a complex salt, an alkali should be added preferably at an amount of 1 to 100 equivalents of the compound of the general formula (III). Aqueous ammonia is used so as to eliminate hydrogen from the ligand, but use may be made of another alkali such as sodium carbonate, potassium carbonate and sodium hydroxide provided that the alkali can facilitate the elimination of the hydrogen satisfactorily.

By the method of the second aspect of the present invention, the metal M in each of the compounds is an element of the periodic table 2A or 2B or Zn; $L^1$, $L^2$ and $L^3$ each are a ligand derived from a compound having a hydroxyl group and an aromatic nitrogen atom (N) within the molecule and being represented by the following structural formula (A), wherein the hydrogen atom of the hydroxyl group is eliminated from the compound; and X and X' are preferably a halogen atom or an anion capable of pairing an alkoxyl group or a phenoxyl group or the like.

The ligand $L^1$ may or may not be o-hydroxyphenylbenzoxazole represented by the structural formula (B) or a derivative thereof; and the ligand $L^2$ may or may not be 8-hydroxyquinoline represented by the aforementioned structural formula (C) or a derivative thereof. The ligand L3 may or may not be the one represented by the aforementioned structural formula (D).

In a third aspect of the present invention, it is provided an optical device having a luminescent layer and/or an electron transfer layer and containing in these layers a bi-nuclear metal complex represented by the following formula (I). General formula (I):

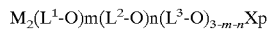

$$M_2(L^1\text{-}O)m(L^2\text{-}O)n(L^3\text{-}O)_{3\text{-}m\text{-}n}X p$$

(wherein M represents a divalent metal atom or Zn; $L^1$, $L^2$ and $L^3$ are ligands, individually different from each other;

X represents an anion;

"m" and "n" represent independently an integer of 0 to 3; and

"p" represents an integer of 0 to 4.)

In the optical device of the third aspect of the present invention, M is an element of the periodic table 2A or an element of the table 2B or Zn; L1, L2 and L3 each are a ligand derived from a compound having a hydroxyl group and an aromatic nitrogen atom (N) within the molecule and being represented by the following structural formula (A), wherein the hydrogen atom of the hydroxyl group is eliminated from the compound; and X is preferably a halogen atom, or an anion capable of pairing an alkoxyl group or a phenoxyl group or the like.

The ligand $L^1$ may or may not be o-hydroxyphenylbenzoxazole represented by the structural formula (B) or a derivative thereof; and the ligand $L^2$ may or may not be 8-hydroxyquinoline represented by the aforementioned structural formula (C) or a derivative thereof. The ligand $L^3$ may or may not be the one represented by the aforementioned structural formula (D).

Additionally, the luminescent layer and/or the electron transfer layer may contain a single type of a bi-nuclear metal complex or plural types of bi-nuclear metal complexes. In such case, a fluorescent dye may be contained therein together with such bi-nuclear metal complex(s).

Specifically, the optical device of the third aspect of the present invention comprises a transparent electrode, a hole transfer layer, a luminescent layer and/or an electron transfer layer, and a negative electrode, sequentially laminated in this order on a substrate, which is preferably configured as an electroluminescent device. Furthermore, such optical device may be applied for use in optical communication systems, photovoltaic devices (for battery), photo-sensitive substances, imaging systems and the like.

So as to enhance the device stability, furthermore, a part or the whole of the device may be coated with a protective layer. So as to adjust the chromaticity, a color filter may be integrated into the device.

In the third aspect of the present invention, preferably, the double-nuclear complex of the first aspect of the present invention should be incorporated into the luminescent layer or the electron transfer layer, or both of the two. As the double-nuclear complex, use may be made of a single type of a double-nuclear complex or a combination of plural types of double-nuclear complexes, singly or in combination with a fluorescent dye such as DCM [4-dicyanomethylene-6-(p-dimethylaminostyryl)-2-methyl-4H-pyrane] of the following formula (E) and quinacridone.

Structural formula (E):

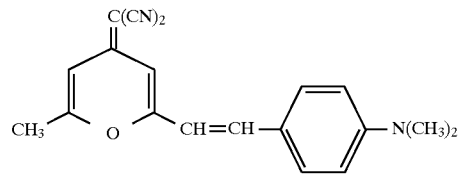

Further, the thickness each of the electrodes, the hole transfer layer, the luminescent layer and the electron transfer layer should be determined, depending on the operation voltage of the device and the like, with no limitation to what will be described in the examples below. The individual layers of the device may be prepared by general vapor deposition and Langmuir-Blodgett's (LB) vapor deposition technique, and additionally by dip-coating process, polymer spinning process, vacuum vapor phase deposition, organic molecular beam epitaxial process (abbreviated as "OMBE" hereinafter) and the like.

A fluorescent substance may be contained in the hole transfer layer or the electron transfer layer.

A fourth aspect of the present invention is an optical device comprising a luminescent layer and an electron transfer layer and containing in these layers an aluminium complex (a complex of aluminium linked with two ligands) represented by the following general formula (IV).

General formula (IV):

$$Al(L\text{-}0)_2 X$$

(wherein L represents a ligand; and X represents an anion.)

In the optical device of the present invention, L is a ligand derived from a compound containing a hydroxyl group and an aromatic nitrogen atom (N) within the molecule and being represented by the following structural formula (F), wherein the hydrogen atom of the hydroxyl group is eliminated from the compound; and X represents a halogen atom (such as F, Cl, Br and I; the same is true hereinbelow), and an anion capable of pairing an alkoxyl group or a phenoxyl group or the like.

Structural formula (F):

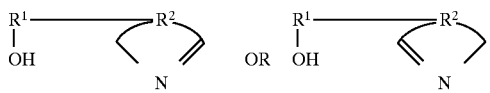

(wherein $R^1$ and $R^2$ are independently a group or an atomic group; $R^1$ may form a ring in cooperation with an atom adjacent to the aromatic nitrogen atom (N) and/or a part of $R^2$; $R^2$ together with the aromatic nitrogen atom (N) and/or an atom adjacent to the nitrogen atom forms a ring.)

Also, the ligand L may be o-hydroxyphenylbenzoxazole represented by the following structural formula (G) or a derivative thereof.

Structural formula (G):

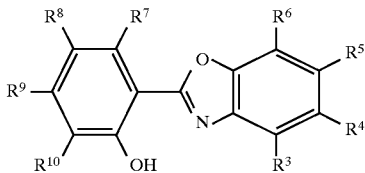

(wherein $R^3$, $R^4$, $R^5$, $R^6$, $R^7$, $R^8$, $R^9$ and $R^{10}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.)

The ligand L may be any one derived from a compound containing a hydroxyl group and an aromatic nitrogen atom within the molecule and having a complexing potency with zinc and aluminium (generally for use in colorimetry), and is not limited to the compound of the aforementioned structural formula (G), for example o-hydroxyphenylbenzoxazole described in the examples below.

Furthermore, a single type of an aluminium complex or plural types of aluminium complexes may be contained in the luminescent layer and/or the electron transfer layer. In such case, a fluorescent dye may be contained together with the aluminium complex (complexes).

Specifically, the optical device of the present invention comprises a transparent electrode, a hole transfer layer, a luminescent layer and/or an electron transfer layer, and a negative electrode, sequentially laminated in this order on a substrate, which is preferably constructed as an electroluminescent device. Furthermore, such optical device may be applied for use in optical communication systems, photovoltaic devices (for battery), photo-sensitive substances, imaging systems and the like.

So as to enhance the device stability, a part or the whole of the device may be coated with a protective layer. So as to adjust the chromaticity, a color filter may be integrated into the device.

In accordance with the present invention, preferably, the aluminium complex should be incorporated into the luminescent layer or the electron transfer layer, or both of the two. As the complex, use may be made of a single type of an aluminium complex or a combination of plural types of aluminium complexes, singly or in combination with a fluorescent dye such as DCM [4-dicyanomethylene-6-(p-dimethylaminostyryl)-2methyl-4H-pyrane] of the following formula (H) and quinacridone.

Structural formula (H):

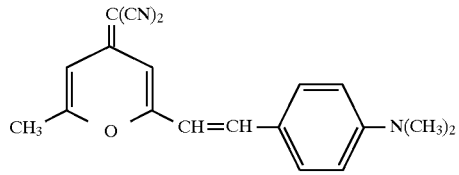

Further, the thickness each of the electrodes, the hole transfer layer, the luminescent layer and the electron transfer layer should be determined, depending on the operation voltage of the device and the like, with no limitation to what will be described in the examples below. The individual layers of the device may be prepared by general vapor deposition and Langmuir-Blodgett's (LB) vapor deposition technique, and additionally by dip-coating process, polymer spinning process, vacuum vapor phase deposition, organic molecular beam epitaxial process (OMBE) and the like.

A fluorescent dye may be contained in the hole transfer layer or the electron transfer layer, so as to adjust the emission wavelength.

The aluminium complex of the fourth aspect of the present invention can be produced by a method of a fifth aspect of the present invention.

More specifically, the fifth aspect of the present invention is a method for producing an aluminium complex represented by the following general formula (IV), comprising reacting in alcohol an aluminium salt represented by the following general formula (V) with a compound represented by the general formula (VI).

General formula (V):

$AlX'_3$ (wherein X' represents an anion.)
General formula (VI):

LOH (wherein L is a group functioning as a ligand.)
General formula (IV)

$Al(L-O)_2X$ (wherein L is the same as described above; and X represents an anion.)

By the present method, the solvent alcohol can stabilize the aluminium complex to recover an objective substance efficiently. As such alcohol, use may be made of a lower alcohol with one to 12 carbon atoms (C1 to C12). Such reaction solvent should be selected so that the yield of a single-nuclear aluminium complex might be the maximum from the respect of the solubilities of the metal salt and the ligand. Any alcohol such as methanol and propanol may be used, with no limitation to ethanol.

Preferably, such alcohol may be used at a weight ratio of 1 to 1,000 to the reaction substances. The reaction should be carried out at a temperature of about the boiling point of the alcohol.

In the examples described below, use is made of ethanol as the reaction solvent and aluminium chloride as the metal salt. However, the metal salt should be selected from the respect of the solubility in the solvent, so it is not limited to chlorides.

So as to eliminate the hydrogen atom from the compound of the general formula (VI) for the preparation of a complex salt, an alkali should be added preferably at an amount of 1 to 100 equivalents of the compound of the general formula (VI). Aqueous ammonia is used so as to eliminate hydrogen from the ligand, but use may be made of another alkali such as sodium carbonate, potassium carbonate and sodium hydroxide provided that the alkali satisfactorily progresses the elimination of the hydrogen.

BRIEF DESCRIPTION OF THE DRAWINGS

FIG. 31 is a luminescent spectrum chart of an organic EL device at a voltage of 9 V in an example of the present invention;

DETAILED DESCRIPTION OF THE INVENTION

Figure 1:
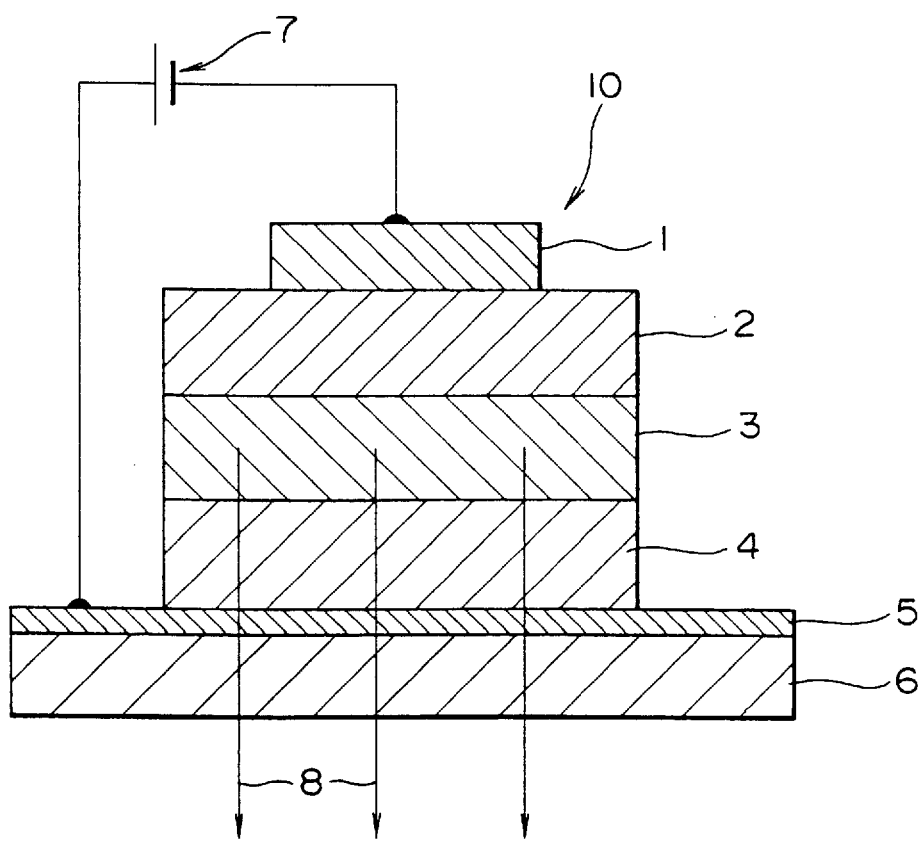
FIG. 1 is a schematic cross sectional view depicting one example of the organic EL device of the present invention.

FIG. 1 depicts one example of organic EL device 10 as the organic luminescent device of the present invention. The EL device 10 is produced by preparing films of ITO (indium tin oxide) transparent electrode 5, hole transfer layer 4, luminescent layer 3, electron transfer layer 2, and negative electrode 1 (for example, aluminium electrode) on transparent substrate 6 (for example, glass substrate) sequentially by vapor deposition for example.

By subsequently applying direct current 7 selectively between the transparent electrode 5 as the positive electrode and the negative electrode 1, a hole injected from the transparent electrode 5 passes through the hole transfer layer 4 to reach the luminescent layer 3, while an electron injected from the negative electrode 1 passes through the electron transfer layer 2 to reach the luminescent layer 3, where the reunion of the electron and the hole occurs whereby luminescence 8 of a given wavelength emits which can be observed from the side of the transparent substrate 6.

In accordance with the present invention, furthermore, an aluminium complex should be contained in the luminescent layer 3, and this may be a layer substantially composed of an aluminium complex alone (which may be a combination of plural types of aluminium complexes) or a layer of an aluminium complex with addition of a fluorescent substance. Additionally, use may be made of an aluminium complex in combination with other luminescent substances such as anthracene, naphthalene, phenanthrene, pyrene, crycene, perylene, butadiene, coumarine, acridine, stilbene and the like. Such aluminium complex or a mixture thereof with a fluorescent substance or the like may be contained in the electron transfer layer 2.

Figure 2:
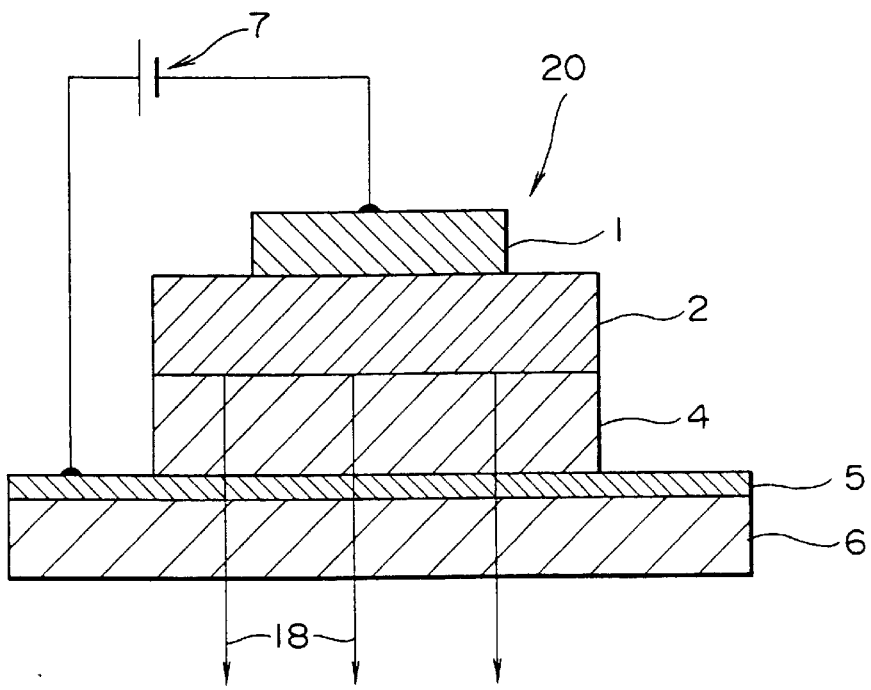
FIG. 2 is a schematic cross sectional view depicting another example of the organic EL device of the present invention.

With the luminescent layer 3 omitted from the example of FIG. 1, FIG. 2 depicts one example of the organic EL device 20 of a configuration such that the aluminium complex or a mixture thereof with a fluorescent substance is contained in the electron transfer layer 2 whereby luminescence 18 of a given wavelength emits in the interface between the electron transfer layer 2 and the hole transfer layer 4.

In the above configuration, use may be made of for example porphyrin-series compounds and amine-series aromatic compounds for the hole transfer layer 4. For the negative electrode I, use may be made of a metal or alloy with a lower work function, such as Al, Mg, Al-Mg alloy, Mg-Ag alloy, Al-Li alloy and Ca.

Figure 3:
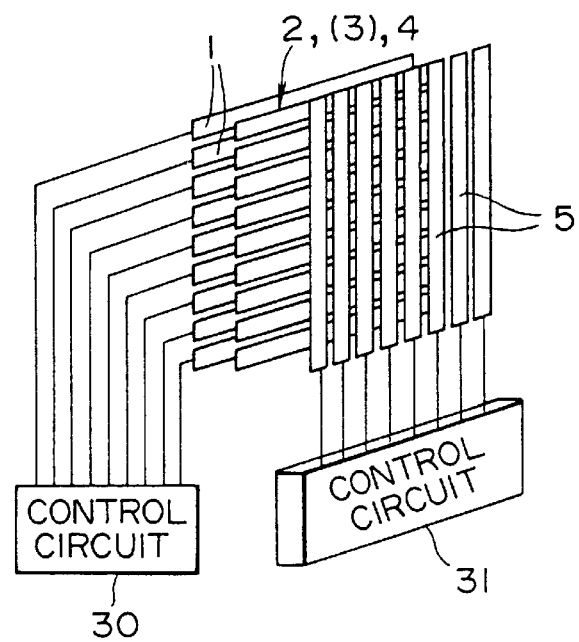
FIG. 3 is a plain view depicting a specific example of the organic EL device of the present invention.

FIG. 3 depicts a specific example of the organic EL device of the present invention. A laminate of individual organic layers (hole transfer layer 4, luminescent layer 3 or electron transfer layer 2) is arranged between the negative electrode 1 and the positive electrode 5. By crossing these electrodes in a matrix form to arrange the electrodes in a striped form and applying a time-series signal voltage by means of control circuits 30, 31 integrating sift registers, structurally, luminescence emits at the crossed positions. Therefore, the device of such configuration may be used for displays as well as for image regeneration systems. By coloring the striped patterns in red (R), green (G) and blue (B), the device may be constructed for full-color or multi-color systems.

The present invention will now be described in detail in examples.

Example 1

Magnesium chloride hexahydrate (MgCl$_2$ 6H$_2$O: 2.02 g) and 2-(o-hydroxyphenyl)-benzoxazole [abbreviated as "B-OH" hereinafter: 6.48 g (3/2-fold moles)] were heated and melt together in ethanol (50 ml) prior to 10-min reflux. Aqueous ammonia (5 ml) was added dropwise to the mixture, and after the completion of the dropwise addition, reflux was continued for another 30 minutes.

After the completion of the reaction, the resulting mixture was left to stand to recover solids by filtration. The solids were sequentially washed in water and ethanol, to recover a white solid. By purifying the solid by vacuum distillation, a magnesium double-nuclear complex (2.3 g) was recovered.

Figure 4:
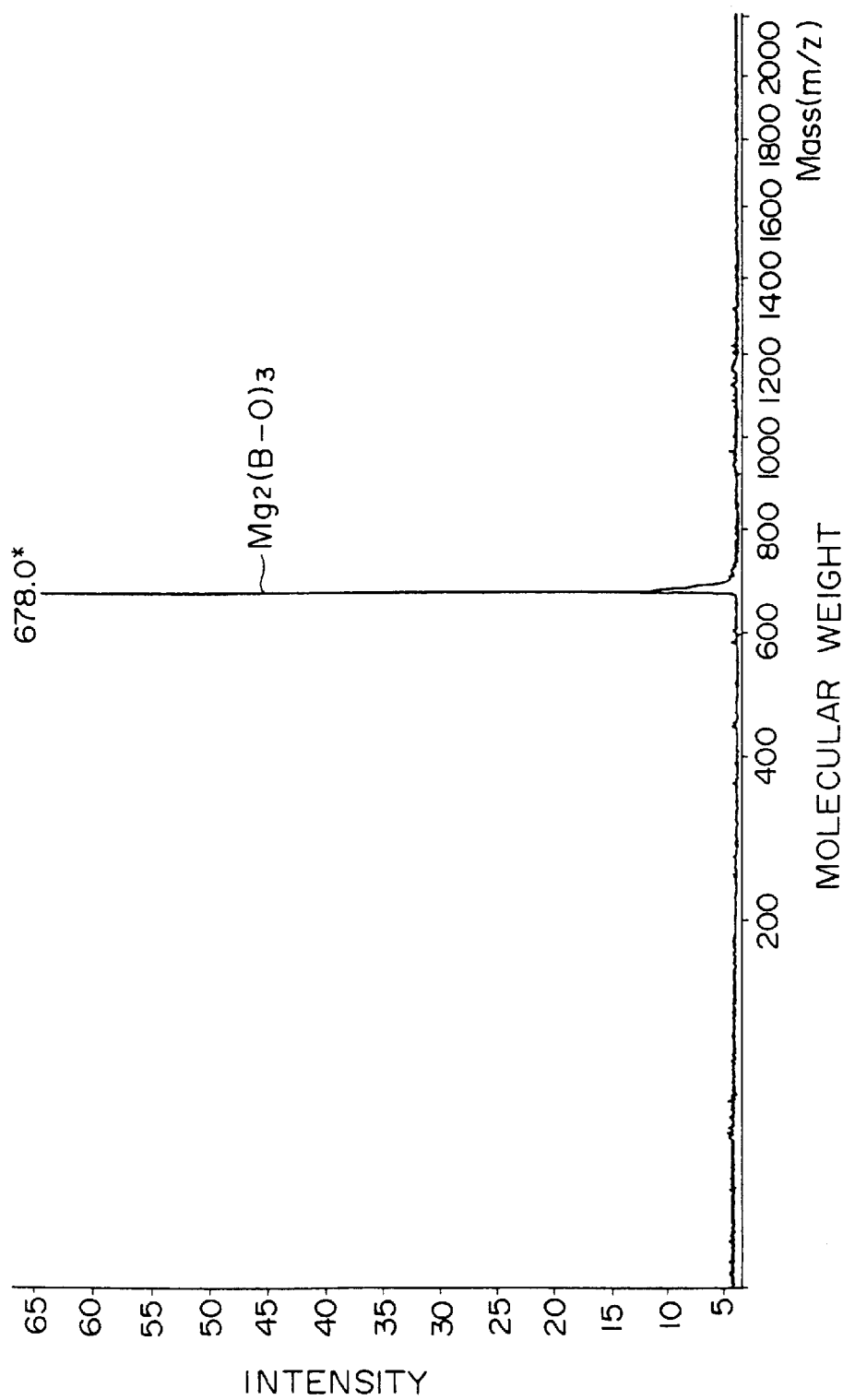
FIG. 4 is a mass-spectrum chart of a magnesium double-nuclear complex produced in one example of the present invention.

FIG. 4 depicts the results of the TOF mass-spectrum analysis of the complex within a molecular weight region of 0 to 2,000 (with a system of Type Vision 2000 manufactured by Finnigan Mat, Co. Ltd.); and FIG. 5 depicts an enlarged view of M+ (parent peak).

FIG. 4 indicates that the molecular weight is 678 [corresponding to Mg$_2$(B-O)$_3$]. Additionally, a halogen (chloride) and alcohol (ethanol) were also detected as the pairing anions.

Figure 5:
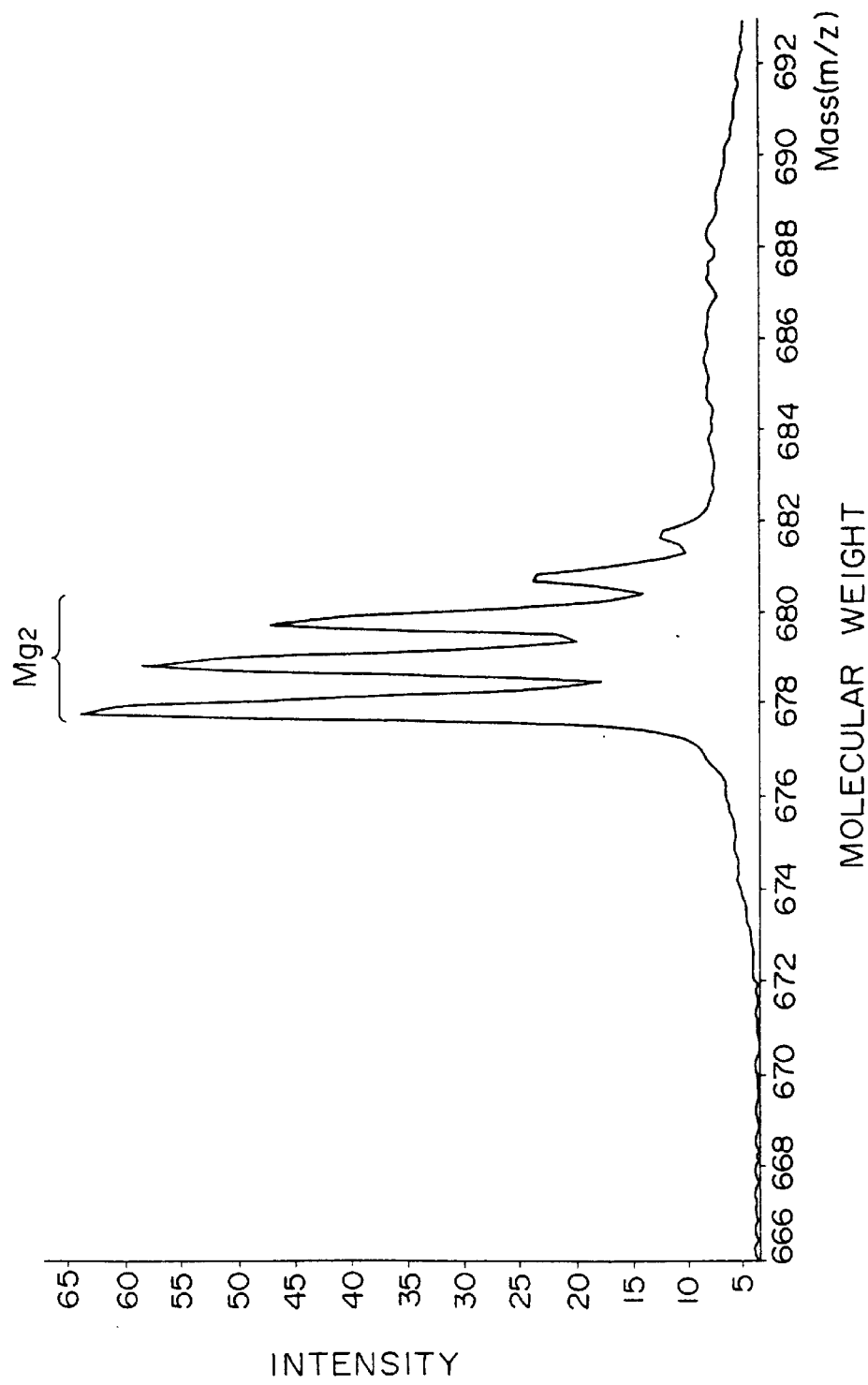
FIG. 5 is an enlarged view depicting the molecular peak on the mass-spectrum of the magnesium double-nuclear complex.

FIG. 5 depicts an enlarged view of the parent peak, wherein a mass pattern (678, 679, 680 and 681) corresponding to the ratio of the magnesium atoms of atomic weights of 24, 25 and 26 in the presence of two magnesium atoms within the molecule indicates that the solid is a magnesium double-nuclear complex.

Figure 6:
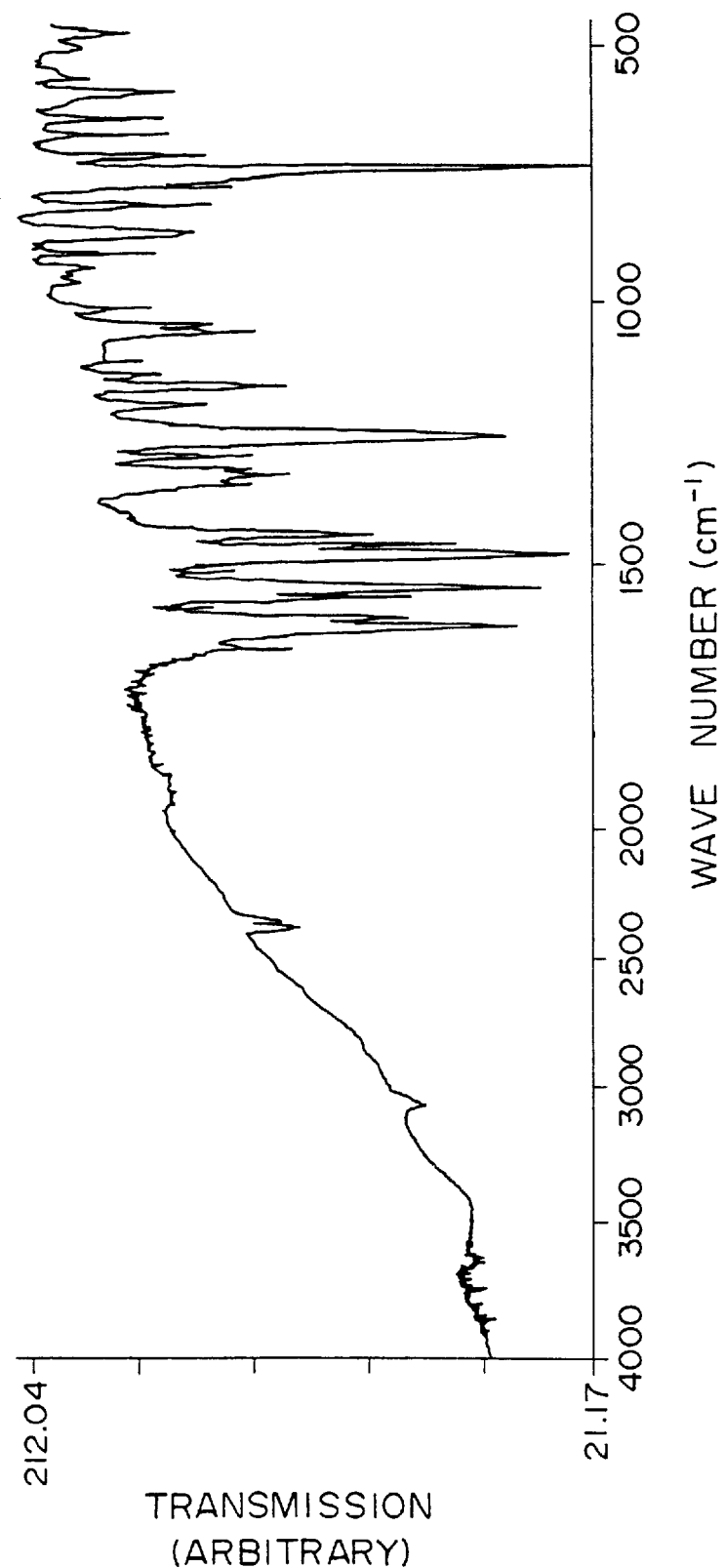
FIG. 6 is an IR spectrum chart of the magnesium double-nuclear complex.

The IR spectrum of the complex is shown in FIG. 6.

Comparative Example 1

The same procedures were repeated as in Example 1, except that the reaction solvent was replaced with water, to recover only a magnesium single-nuclear complex of the formula Mg(B-O)$_2$, with no yield of any double-nuclear complex.

Example 2

Magnesium chloride hexahydrate (MgCl$_2$ 6H$_2$O: 2.02 g) and 8-quinolinol (abbreviated as "Q-OH" hereinafter: 4.35 g) were heated and melt together in ethanol (50 ml) prior to 10-min reflux. Aqueous ammonia (5 ml) was added dropwise to the mixture, and after the completion of the dropwise addition, reflux was continued for another 30 minutes.

After the completion of the reaction, the resulting mixture was left to stand to recover solids by filtration. The solids were sequentially washed in water and ethanol, to recover a yellow solid. By purifying the solid by vacuum distillation, an 8-quinolinol magnesium double-nuclear complex (2.0 g) was recovered.

Figure 7:
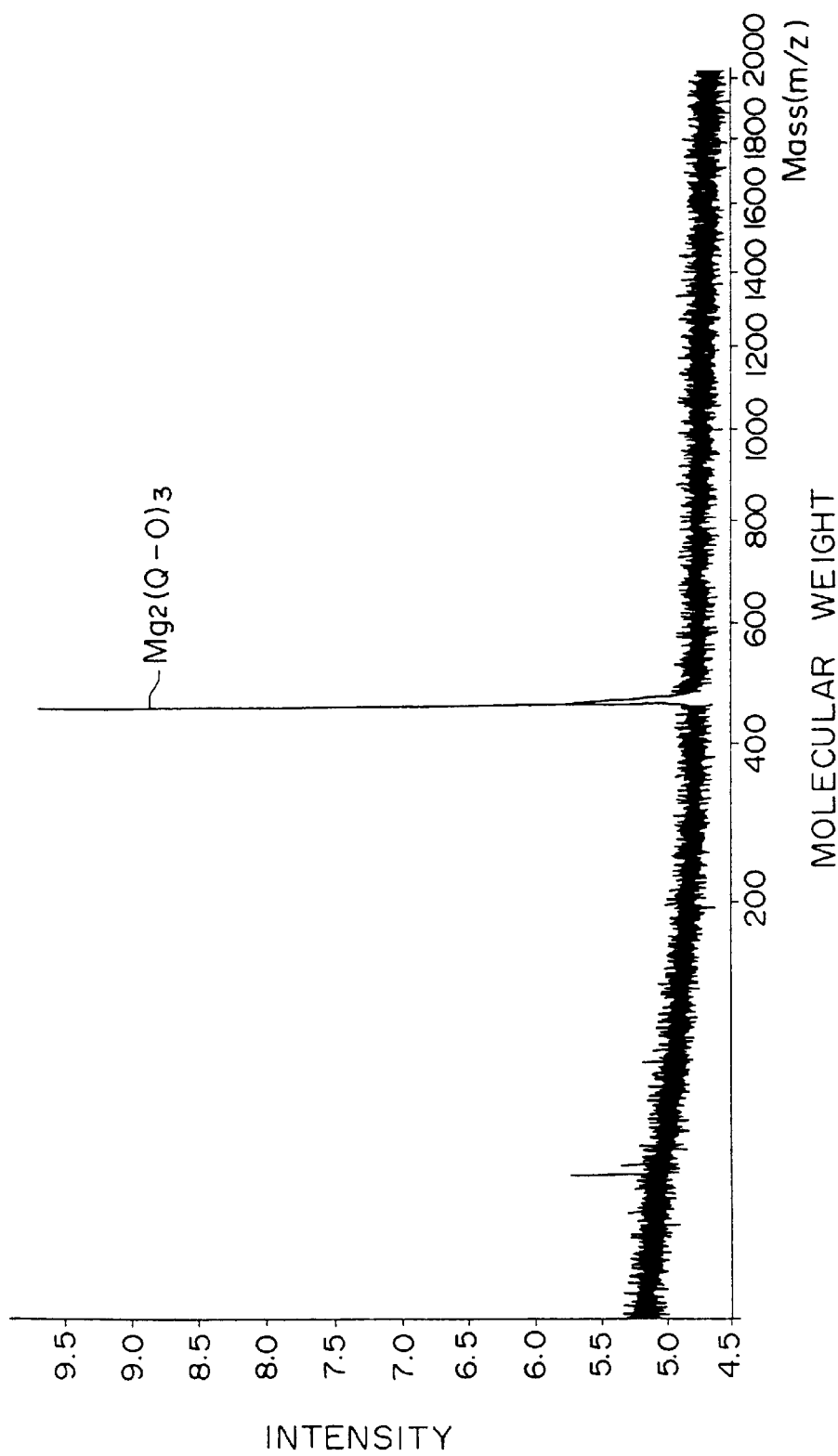
FIG. 7 is a mass-spectrum chart of a magnesium double-nuclear complex produced in another example of the present invention.
Figure 8:
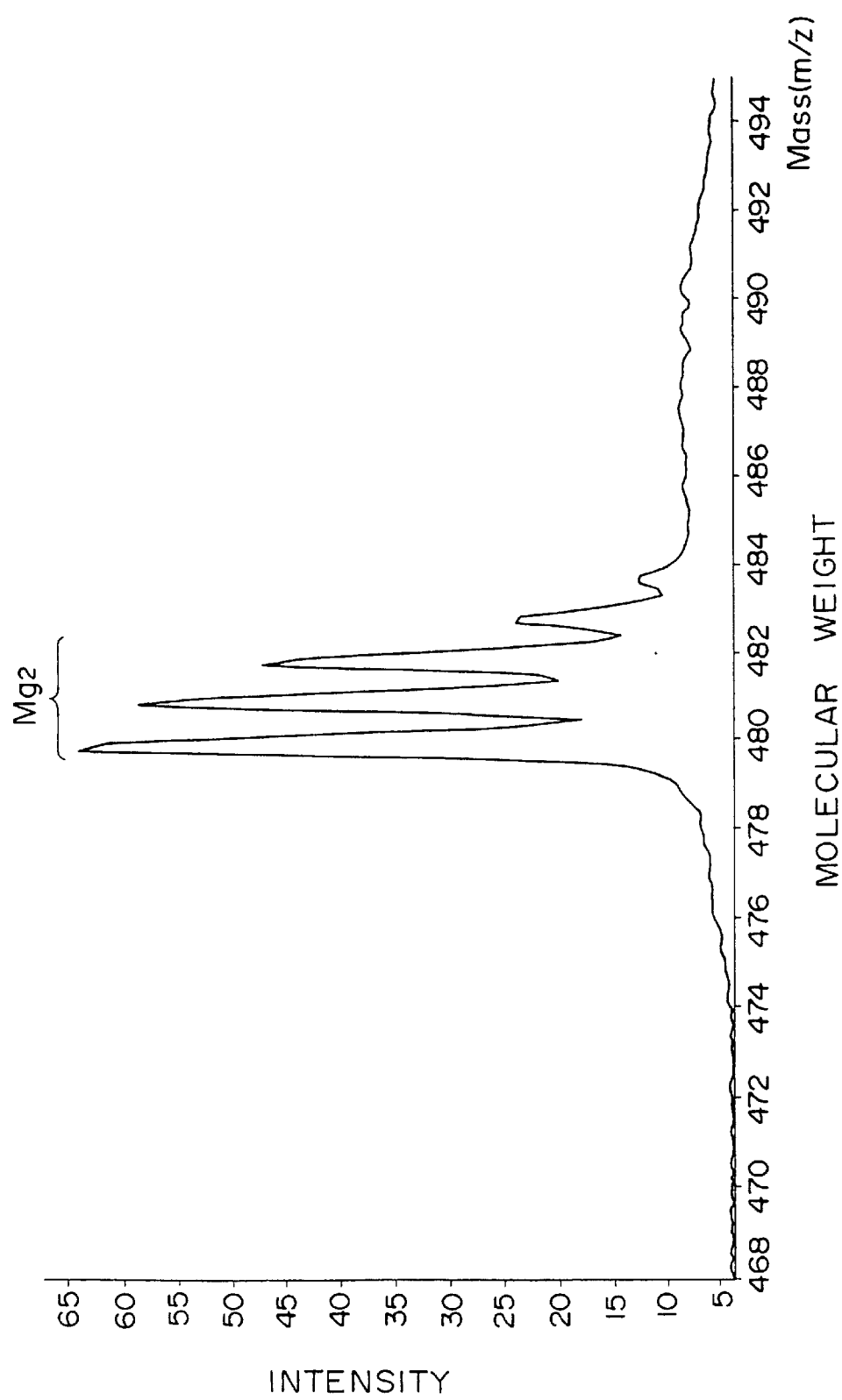
FIG. 8 is an enlarged view depicting the molecular peak on the mass-spectrum of the magnesium double-nuclear complex.

FIG. 7 depicts the results of the TOF mass-spectrum analysis of the complex within a molecular weight region of 0 to 2,000; and FIG. 8 depicts an enlarged view of M+ (parent peak).

FIG. 7 indicates that the molecular weight is 480 (corresponding to Mg$_2$(Q-O)$^3$). Additionally, a halogen (chloride) and alcohol (ethanol) were also detected as the pairing anions.

FIG. 8 depicts an enlarged view of the parent peak, wherein a mass pattern (480, 481, 482, and 483) corresponding to the ratio of the magnesium atoms of atomic weights of 24, 25 and 26 in the presence of two magnesium atoms within the molecule indicates that the solid is a magnesium double-nuclear complex.

Figure 9:
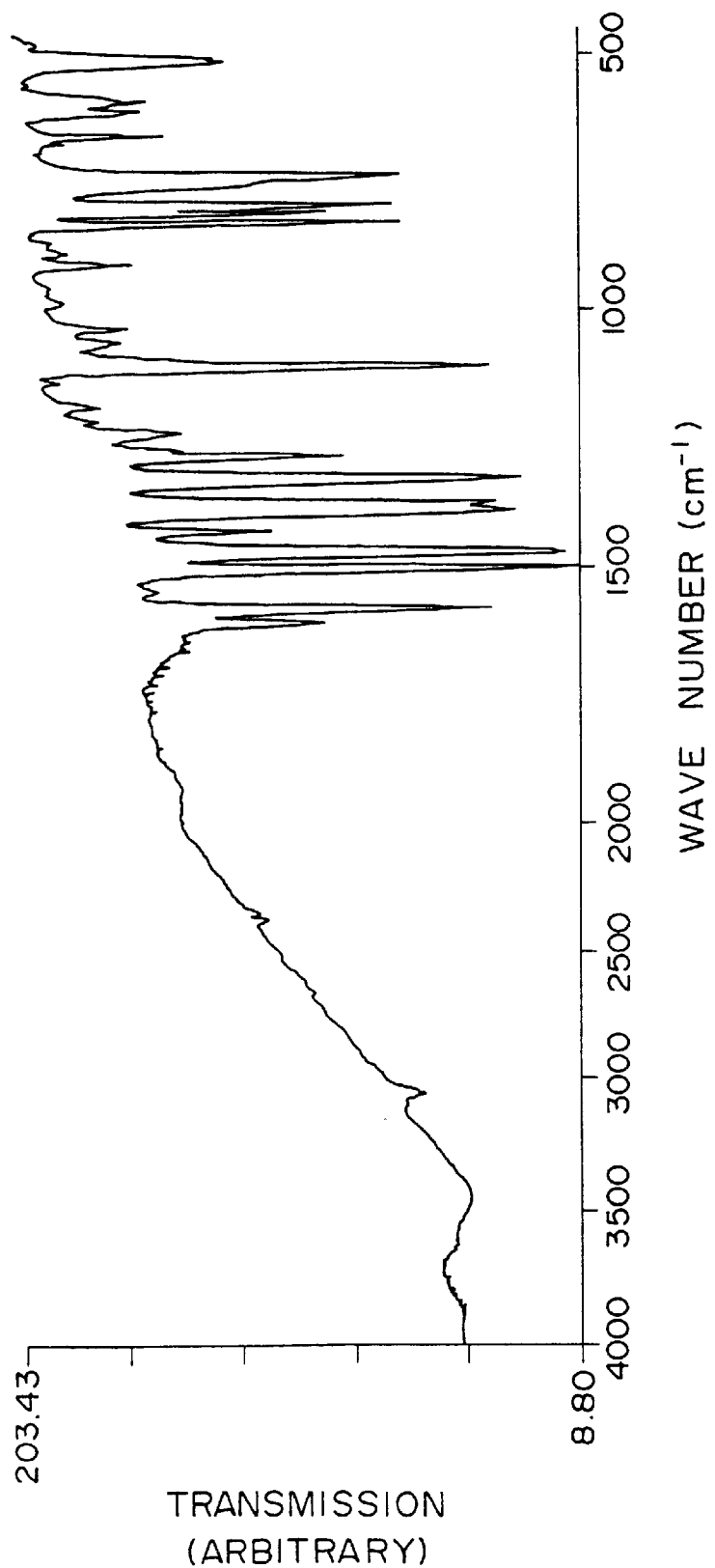
FIG. 9 is an IR spectrum chart of the magnesium double-nuclear complex.

The IR spectrum of the complex is shown in FIG. 9.

Example 3

One example of applying the magnesium double-nuclear complex [Mg$_2$(B-0)$_3$] yielded in Example 1 to an organic EL device will now be described below.

By preparing films of a hole transfer agent TPD [N,N'-bis(3-methylphenyl)1,1'-biphenyl-4,4'-diamine of the following formula (I)] and the magnesium double-nuclear complex, individually at a film thickness of 500 angstroms, on a glass/ITO substrate by vacuum deposition, a hole transfer layer and a luminescent layer (also serving as an electron transfer layer) were sequentially formed thereon. As a metal electrode (negative electrode), furthermore, aluminium was laminated at a thickness of 500 angstroms thereon to generate an organic EL device.

Structural formula (I):

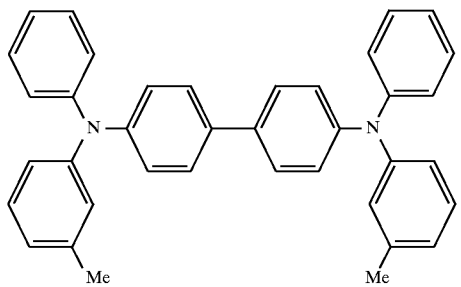

The conditions for the vacuum deposition described above are as follows.

Vacuum deposition rate:

2 to 4 angstroms/sec for TPD 2 to 4 angstroms/sec for the magnesium complex 11 to 13 angstroms/sec for the negative electrode.

Vacuum degree:

$2 \times 10^{-6}$ Torr or less.

Figure 10:
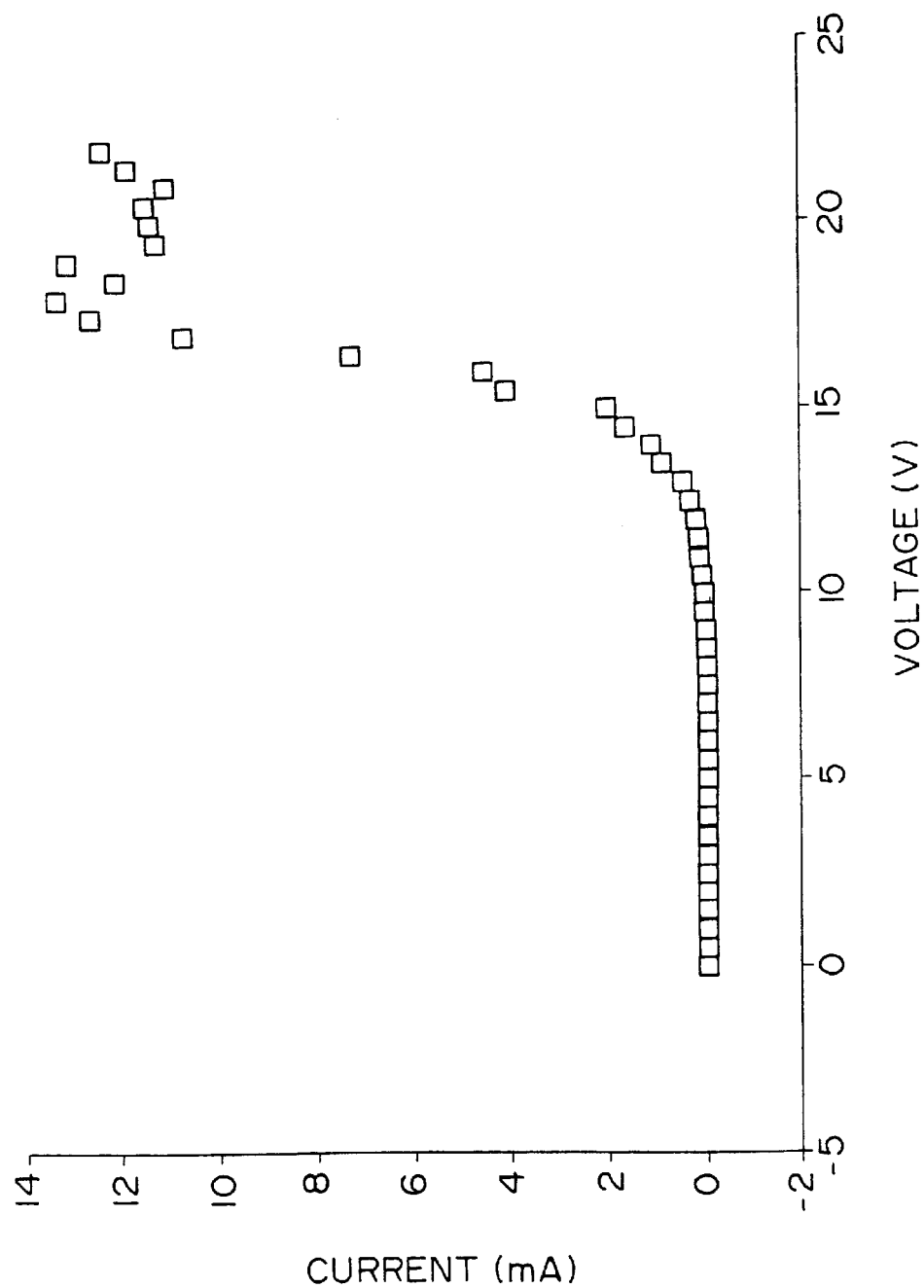
FIG. 10 is a current-voltage curve of an organic EL device of another example of the present invention.
Figure 11:
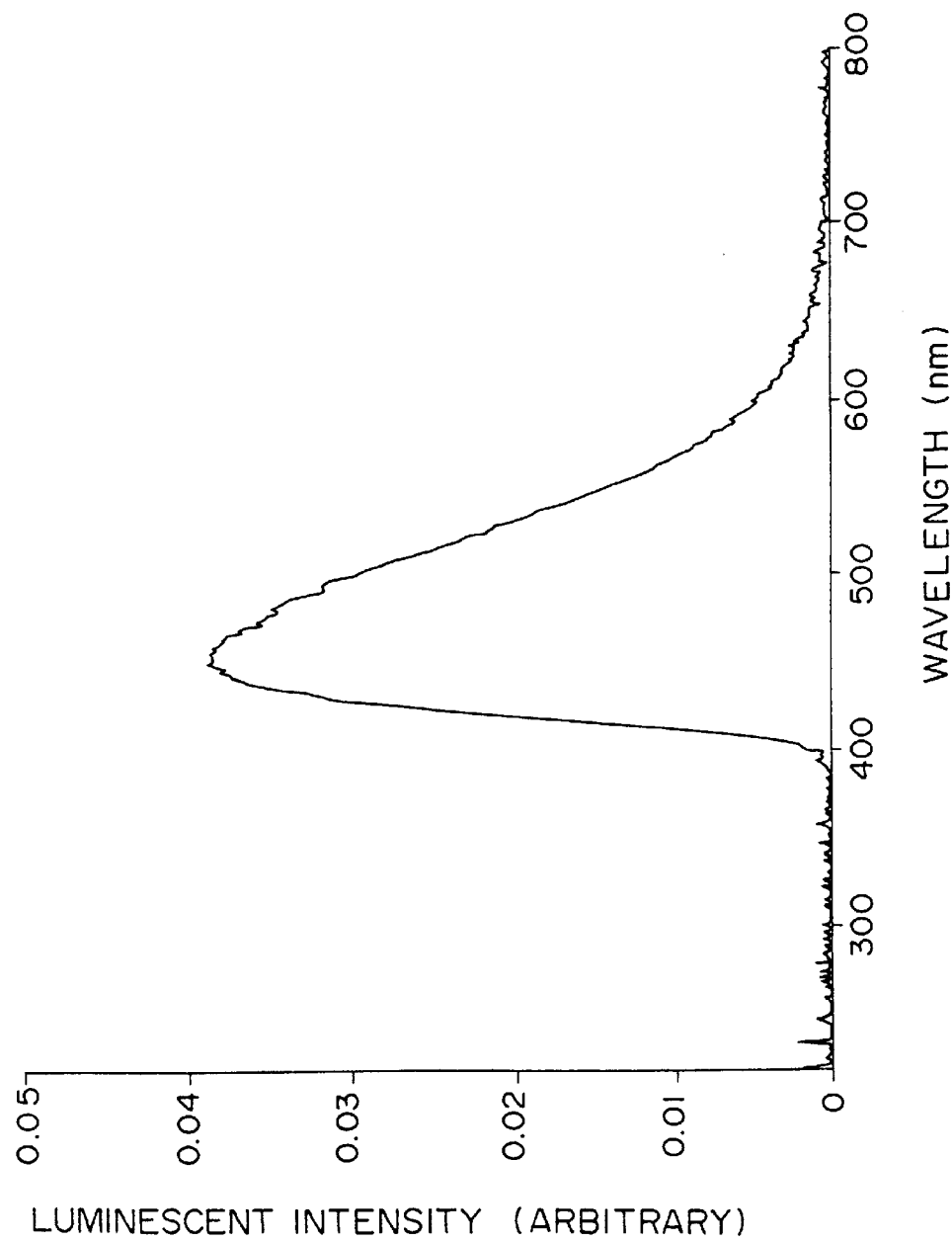
FIG. 11 a luminescent spectrum chart of the organic EL device.

FIG. 10 depicts the current-voltage performance of the organic EL device prepared in the present Example. Electric current starts to flow at a voltage of 12 V, accompanied with blue luminescence. FIG. 11 depicts the emission spectrum from the EL device vs. the output ratio of a photoelectric multiplier at a voltage of 18 V (the same graphic representation is used below). The emission peak is at 460 nm, indicating that the peak wavelength resides in a region of short wavelength.

Example 4

Figure 12:
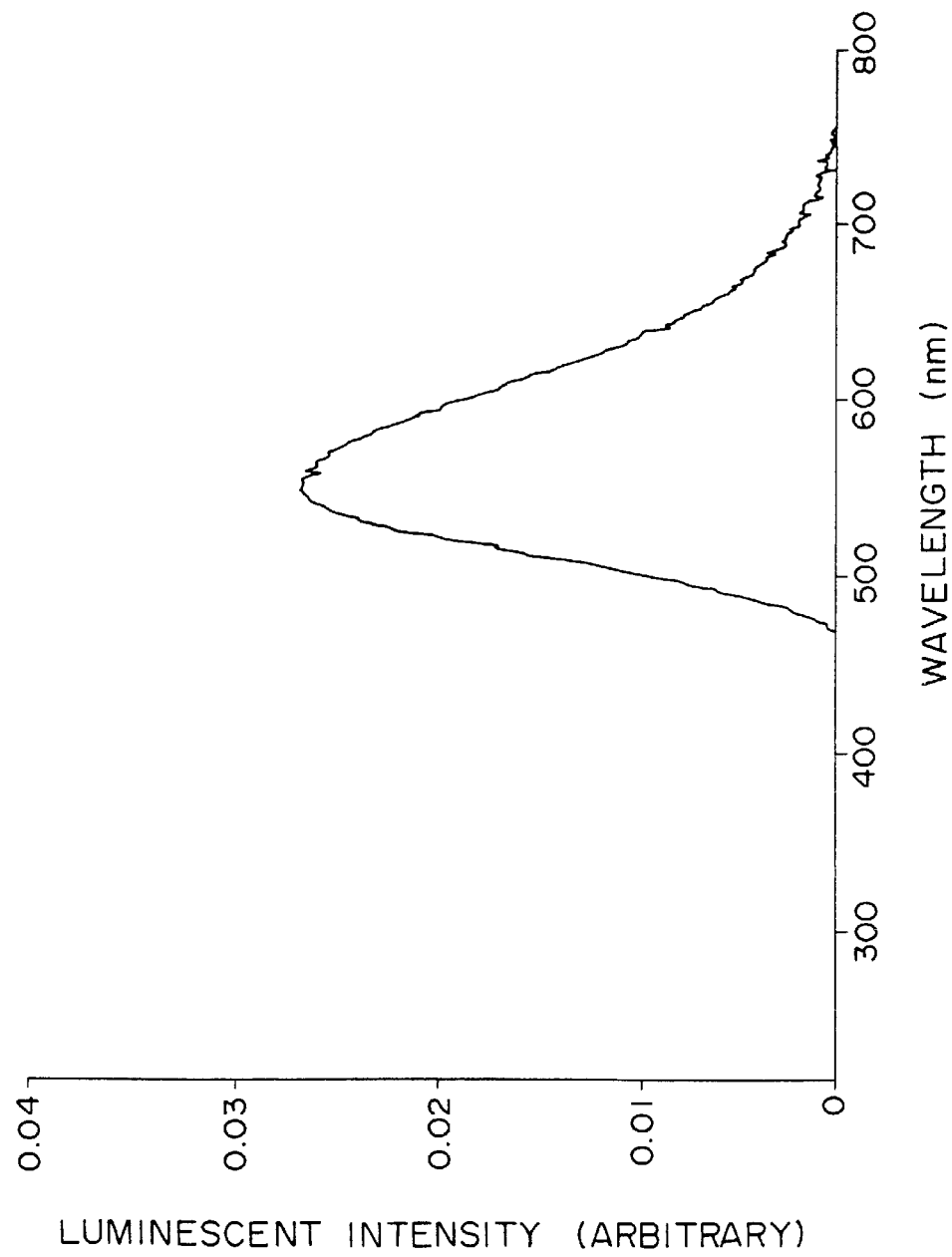
FIG. 12 is a luminescent spectrum chart of another organic EL device of the present invention.

The same procedures were repeated as in Example 3, except that the 8-quinolinol magnesium double-nuclear complex prepared in Example 2 was used in place of the $Mg_2(B-0)_3Cl$. FIG. 12 depicts the emission spectrum from the EL device. The emission peak is at 550 nm, with green luminescence.

Comparative Example 2

The same procedures were repeated as in Example 3 to prepare an organic EL device, except that the oxine complex [tris-(8-hydroxyquinoline) aluminium] reported in the conventional art described above was used in place of the substance of the luminescent layer (electron transfer layer) of the Example 3.

Figure 13:
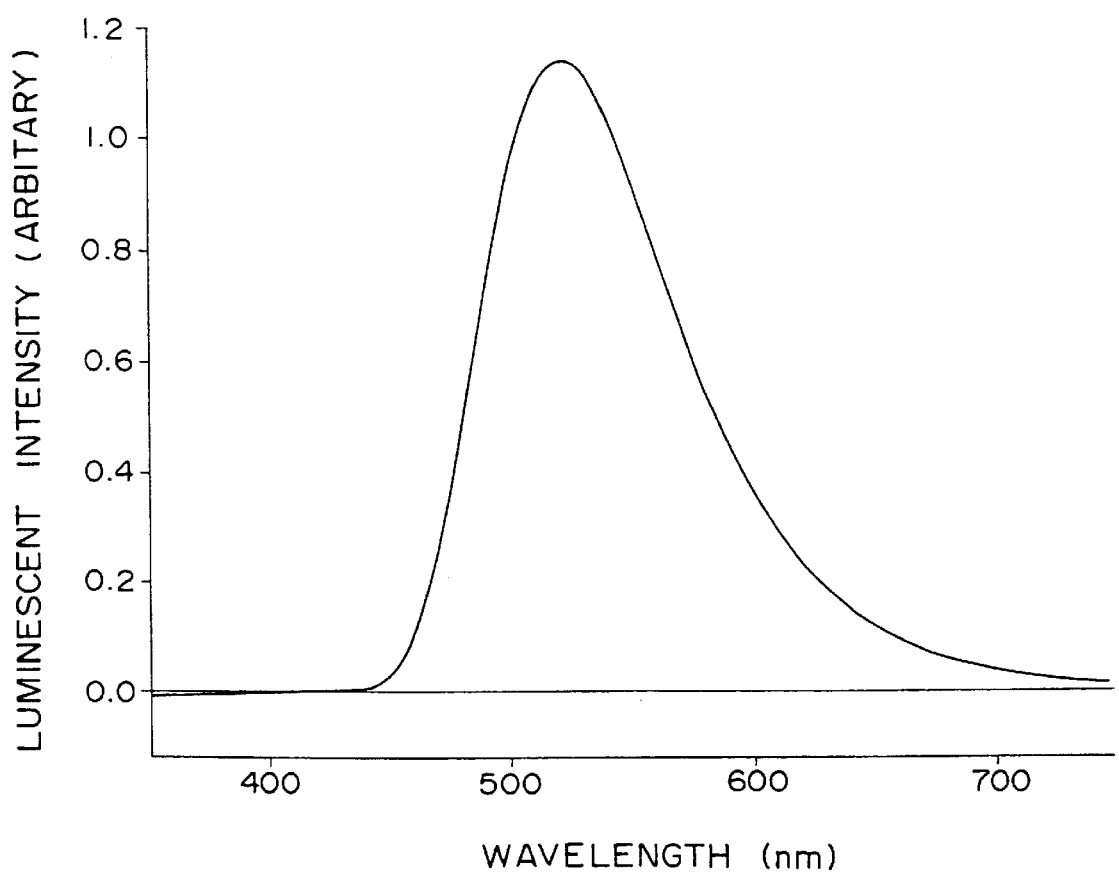
FIG. 13 is a luminescent spectrum chart of an organic EL device of a comparative example.

As shown in FIG. 13, the EL device has an emission peak at about 523 nm, with green luminescence. Thus, the peak wavelength is sift to a longer wavelength than that of Example 3.

Example 5

Magnesium chloride hexahydrate ($MgCl_2$ $6H_2O$: 2.02 g), 2-(o-hydroxyphenyl)-benzoxazole [B-OH: 6.48 g (3/2-fold moles)] and 8-quinolinol [Q-OH: 4.35 g (3/2fold moles)] were heated and melt together in ethanol (50 ml) prior to 10-min reflux. Aqueous ammonia (5 ml) was added dropwise to the mixture, and after the completion of the dropwise addition, reflux was continued for another 30 minutes.

After the completion of the reaction, hot alcohol was used to extract soluble matters, followed by addition of water for re-precipitation, and the resulting precipitate was filtered to recover solids. The solids were sequentially washed in water and ethanol, to recover a white solid. By purifying the solid by vacuum distillation, a magnesium double-nuclear complex (3.1 g) with mixed ligands was recovered.

The TOF mass-spectrum analysis of the reaction product within a molecular weight region of 0 to 2,000 indicates the presence of parent peaks at molecular weights of 678 [$Mg_2(B-O)_3$], 612 [$Mg_2(B-O)_2(Q-O)$], 546 [$Mg_2$ (B-O)(Q-O)$_2$], 480 [$Mg_2$ (Q-O)3].

Figure 14:
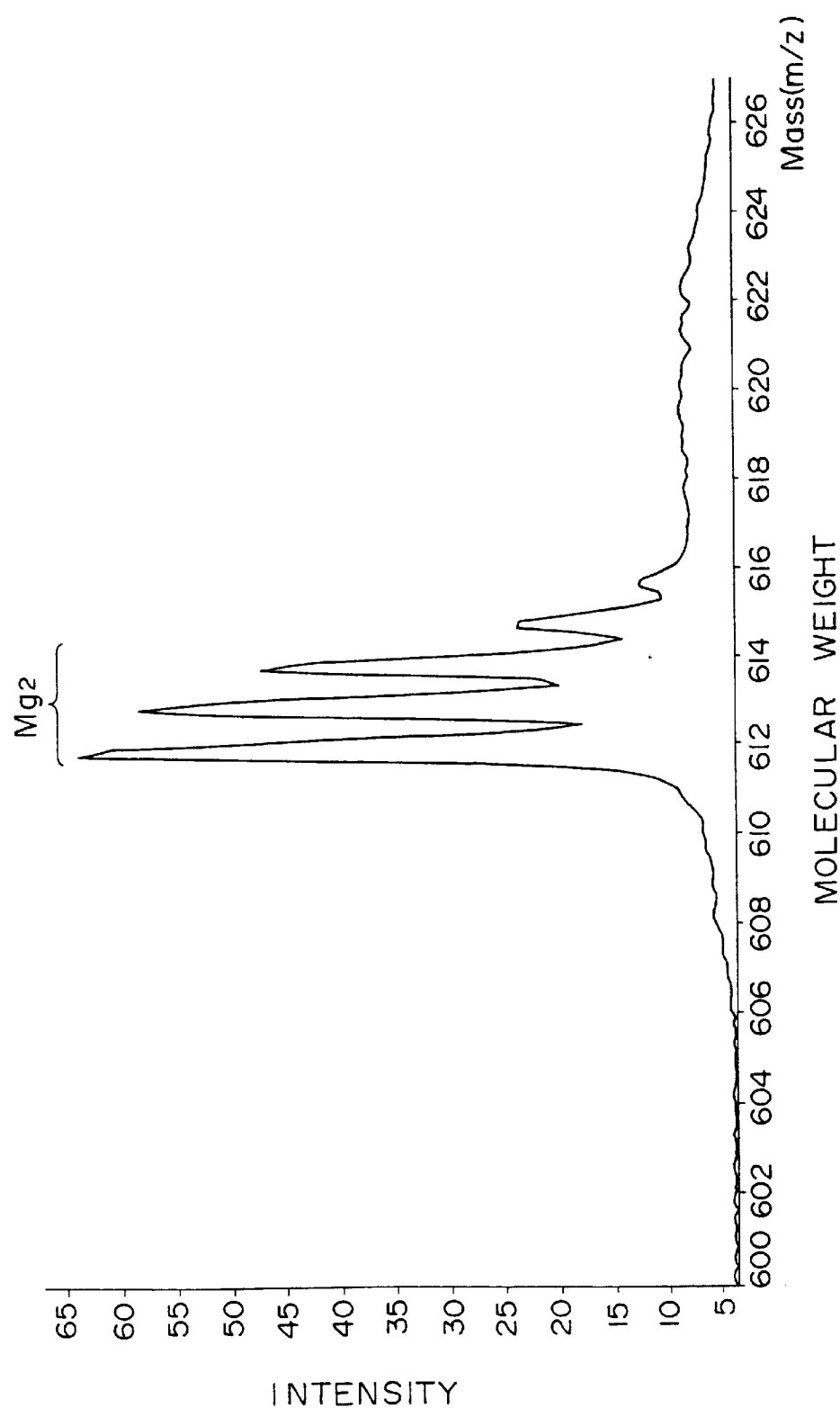
FIG. 14 is a mass-spectrum chart of an isolated $Mg_2(B-O)_2(Q-O)$.
Figure 15:
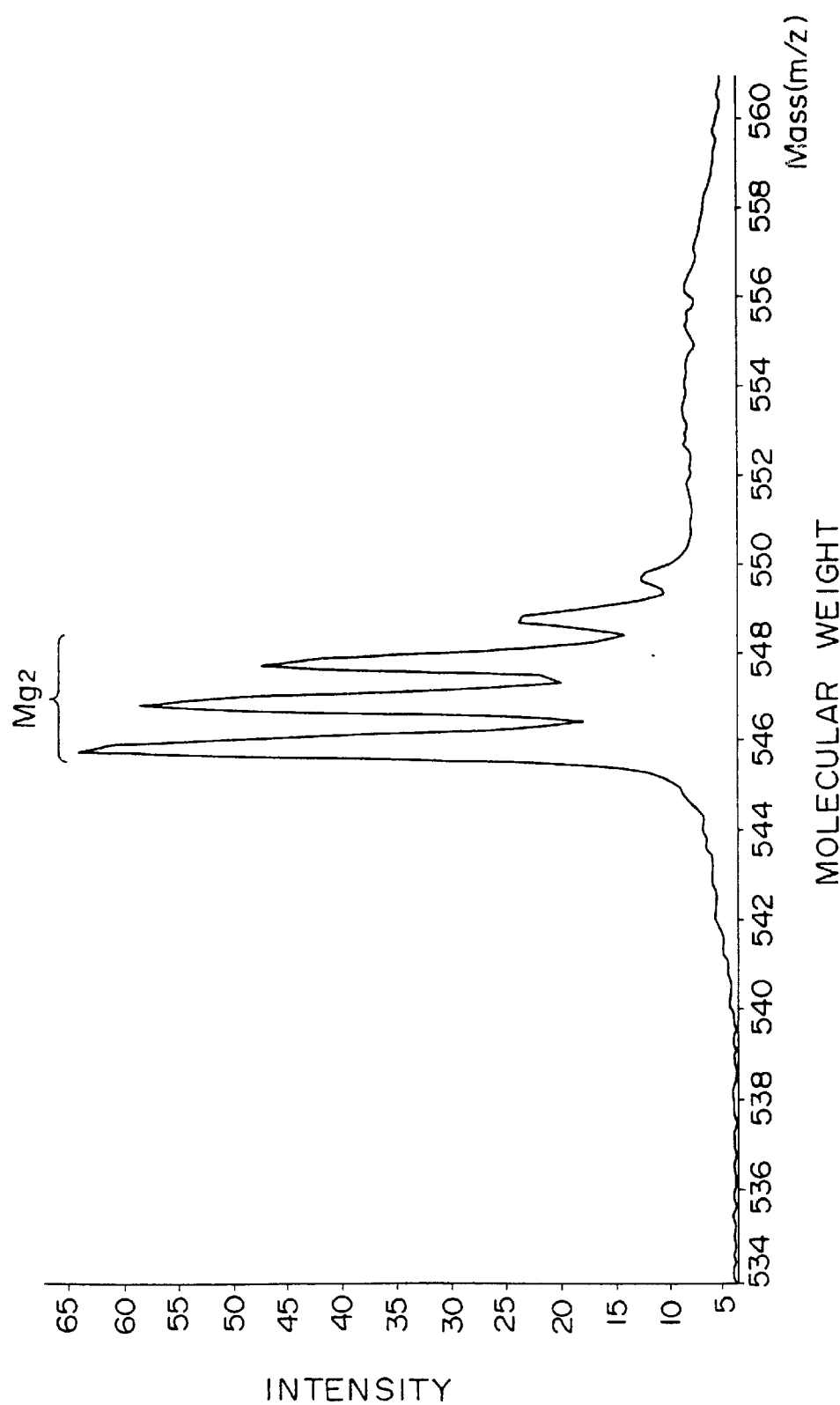
FIG. 15 is a mass-spectrum chart of an isolated $Mg2(B-O)(Q-O)2$.

FIG. 14 depicts the mass spectrum of the isolated Mg2 (B-O)$_2$ (Q-O); and FIG. 15 depicts the mass spectrum of $Mg_2(B-O)(Q-O)_2$.

In FIG. 14, a mass pattern (612, 613 and 614) corresponding to the ratio of magnesium atoms with atomic weights of 24, 25 and 26 is shown, while in FIG. 15, a mass pattern (546, 547 and 548) corresponding to the ratio of zinc atomic weights is shown. Both the figures indicate that the products are magnesium double-nuclear complexes with mixed ligands.

Example 6

Adding 1-hydroxyphenazine (5.88 g; 3/2-fold moles) to the raw materials of Example 5 and repeating the same procedures as in the Example, a magnesium double-nuclear complex (yellow solid) with three types of mixed ligands was yielded.

Example 7

The same procedures were repeated as in Example 6, except that $CdCl_2$ 2(1/2) $H_2O$ (2.28 g) was used in place of the magnesium chloride. A cadmium double-nuclear complex with three types of mixed ligands was prepared.

Example 8

Zinc chloride (2.72 g) and 2-(o-hydroxyphenyl)-benzoxazole [abbreviated as "B-OH" hereinafter: 6.48 g (3/2-fold moles)] were heated and melt together in ethanol (50 ml) prior to 10-min reflux. Aqueous ammonia (10 ml) was added dropwise to the mixture, and after the completion of the dropwise addition, reflux was continued for another 30 minutes.

After the completion of the reaction, the resulting mixture was left to stand to recover solids by filtration. The solids were sequentially washed in water and ethanol, to recover a pale yellow solid. By purifying the solid by vacuum distillation, a zinc double-nuclear complex (4.2 g) was recovered.

Figure 16:
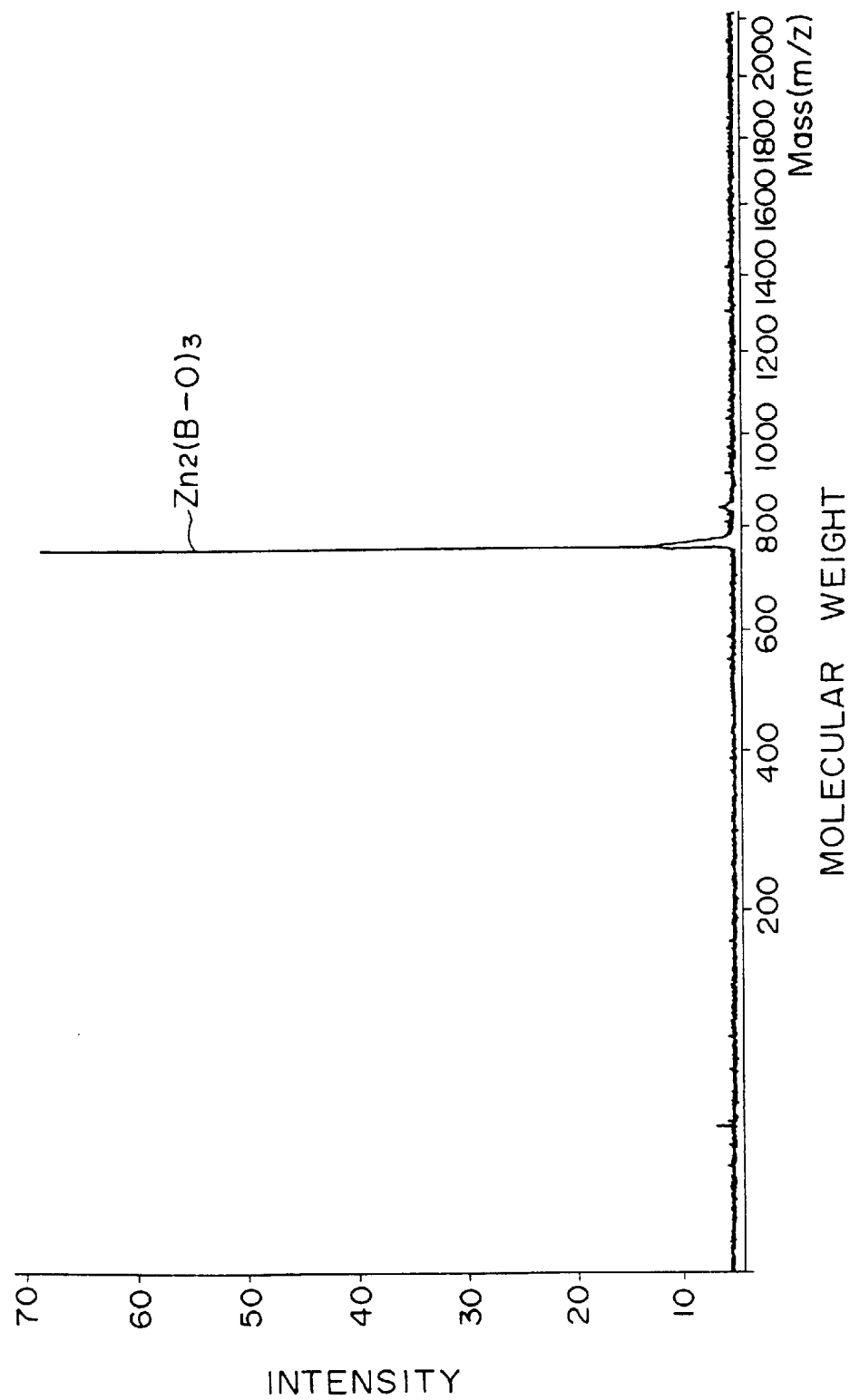
FIG. 16 is a mass-spectrum chart of a zinc double-nuclear complex produced in one example of the present invention.

FIG. 16 depicts the results of the TOF mass-spectrum analysis of the complex within a molecular weight region of 0 to 2,000 (with a system of Type Vision 2000 manufactured by Finnigan Mat, Co. Ltd.); and FIG. 17 depicts an enlarged view of M+ (parent peak).

FIG. 16 indicates that the molecular weight is 758 [corresponding to $Zn_2(B-O)_3$]. Additionally, a halogen (chloride) and alcohol (ethanol) were also detected as the pairing anions.

Figure 17:
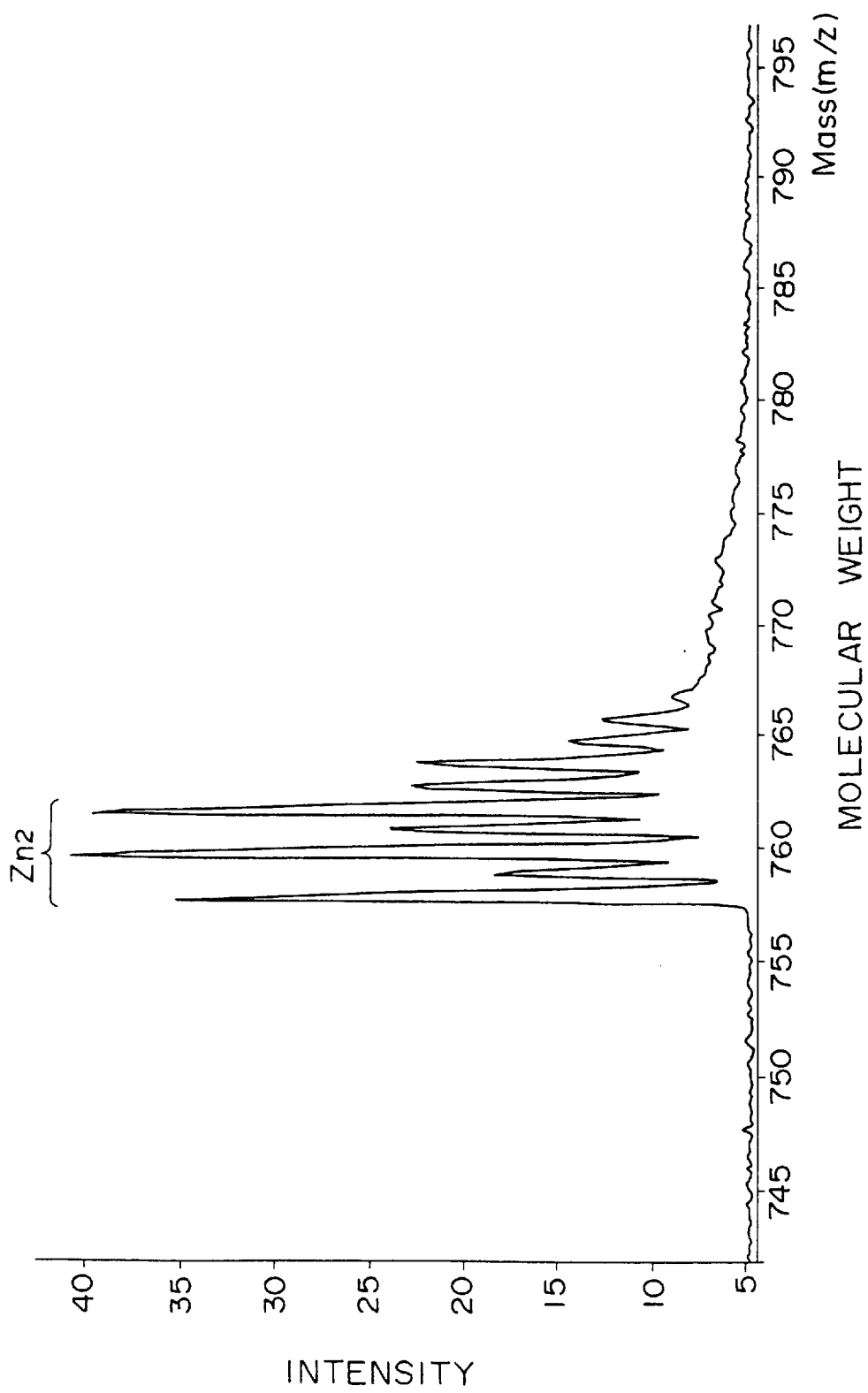
FIG. 17 is an enlarged view depicting the molecular peak on the mass-spectrum of the zinc double-nuclear complex.

FIG. 17 depicts an enlarged view of the parent peak, wherein a mass pattern (758, 760, and 762) corresponding to the ratio of the zinc atoms of atomic weights of 64, 66, 68 and 70 in the presence of two zinc atoms within the molecule indicates that the solid is a zinc double-nuclear complex.

Figure 18:
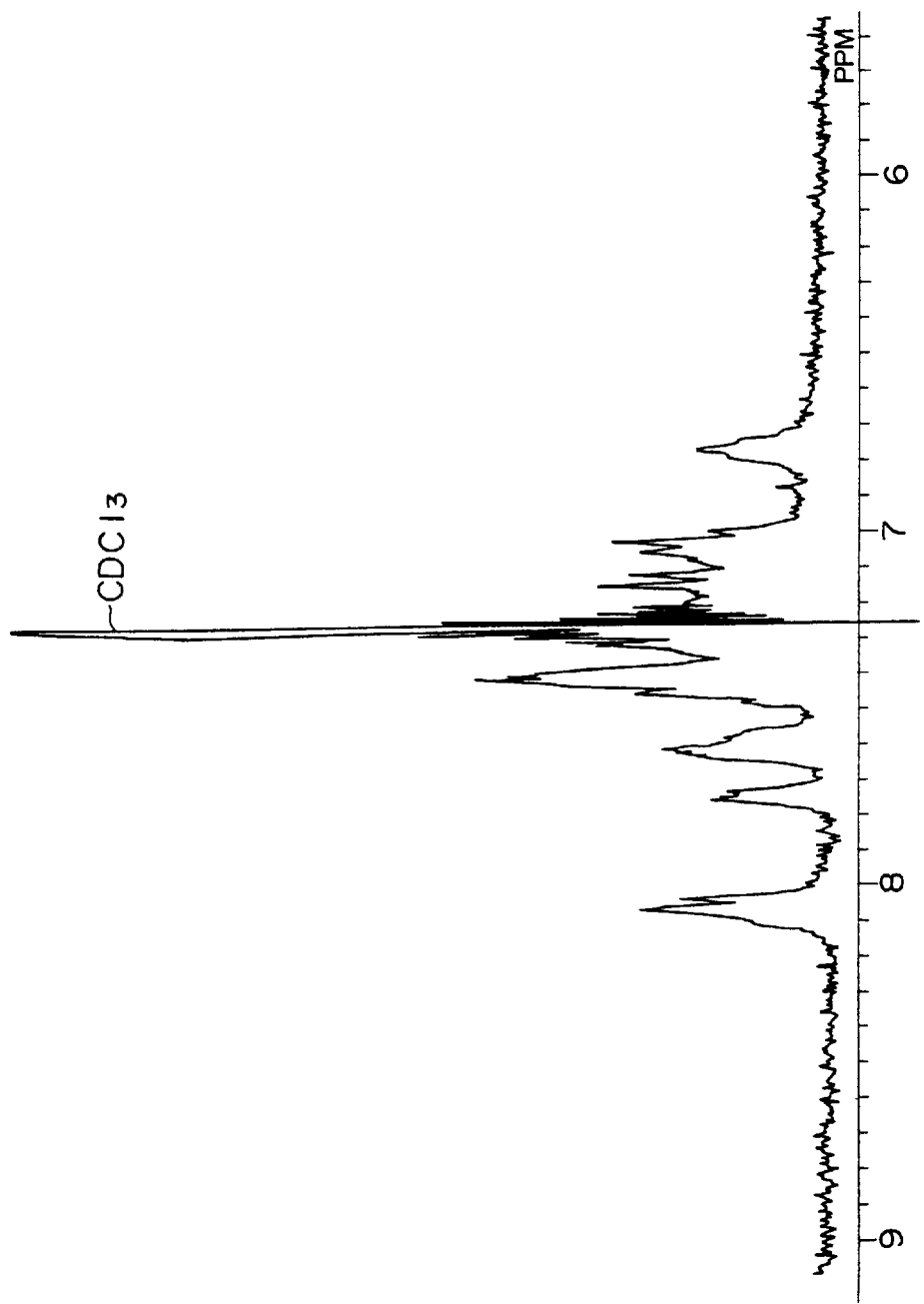
FIG. 18 is a proton-NMR spectrum chart of the zinc double-nuclear complex.

The $^1$H-NMR spectrum of the complex (in $CdCl_3$) is shown in FIG. 18.

Comparative Example 3

The same procedures were repeated as in Example 1, except that the reaction solvent was replaced with water, to recover only a zinc single-nuclear complex of the formula $Zn(B-O)_2$, with no yield of any double-nuclear complex.

Example 9

Zinc chloride (2.72 g) and 8-quinolinol (abbreviated as "Q-OH" hereinafter; 4.35 g) were heated and melt together in ethanol (50 ml) prior to 10-min reflux. Aqueous ammonia (10 ml) was added dropwise to the mixture, and after the completion of the dropwise addition, reflux was continued for another 30 minutes.

After the completion of the reaction, the resulting mixture was left to stand to recover solids by filtration. The solids were sequentially washed in water and ethanol, to recover a yellow solid. By purifying the solid by vacuum distillation, an 8-quinolinol zinc double-nuclear complex (3.0 g) was recovered.

Figure 19:
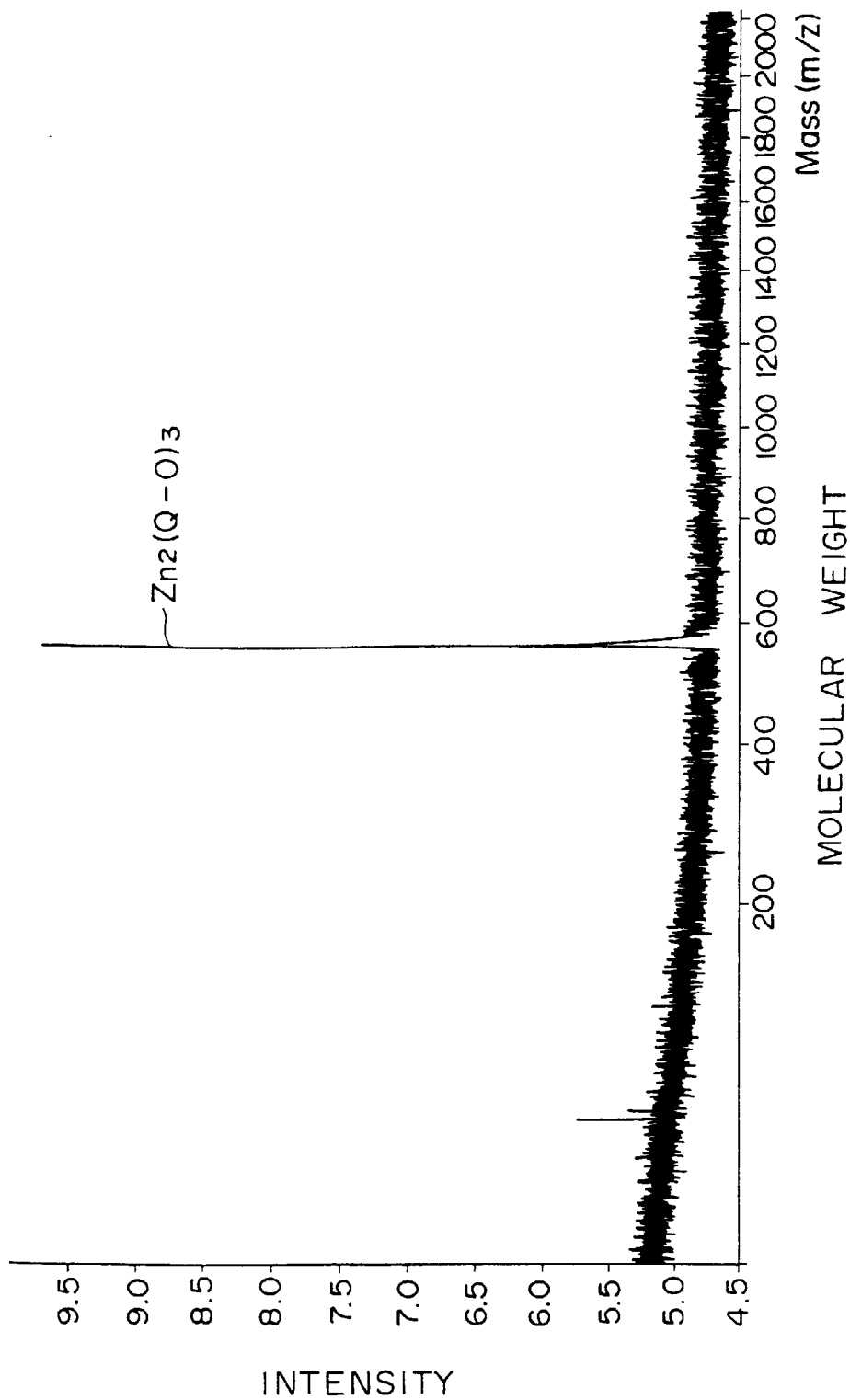
FIG. 19 is a mass-spectrum chart of a zinc double-nuclear complex produced in another example of the present invention.
Figure 20:
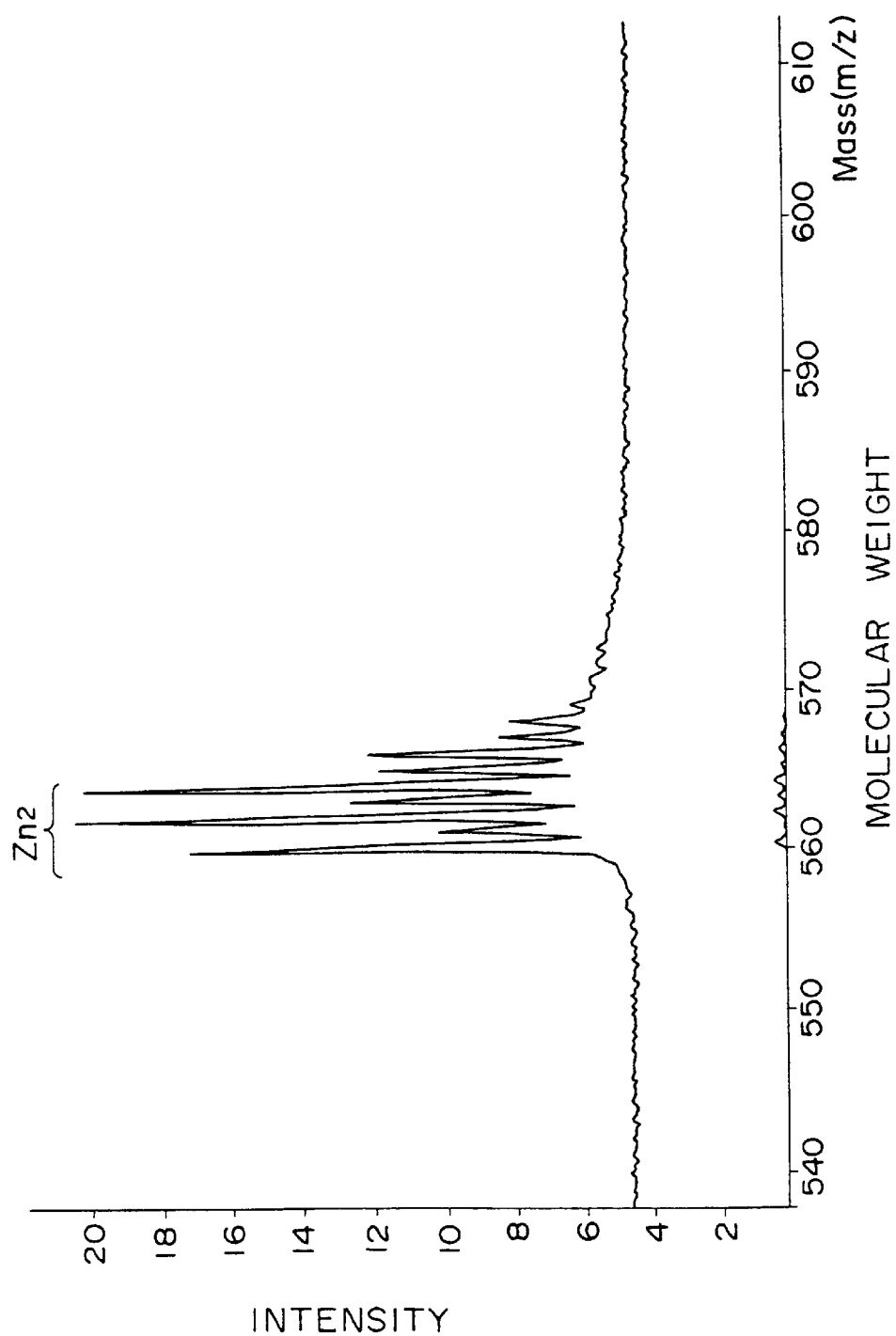
FIG. 20 is an enlarged view depicting the molecular peak on the mass-spectrum of the zinc double-nuclear complex.

FIG. 19 depicts the results of the TOF mass-spectrum analysis of the complex within a molecular weight region of 0 to 2,000; and FIG. 20 depicts an enlarged view of M+ (parent peak) .

FIG. 19 indicates that the molecular weight is 560 [corresponding to $Zn_2(B-O)_3$] Additionally, a halogen (chloride) and alcohol (ethanol) were also detected as the pairing anions.

FIG. 20 depicts an enlarged view of the parent peak, wherein a mass pattern (560, 562 and 564) corresponding to the ratio of the zinc atoms of atomic weights of 64, 66, 68 and 70 in the presence of two zinc atoms within the molecule indicates that the solid is a zinc double-nuclear complex.

Figure 21:
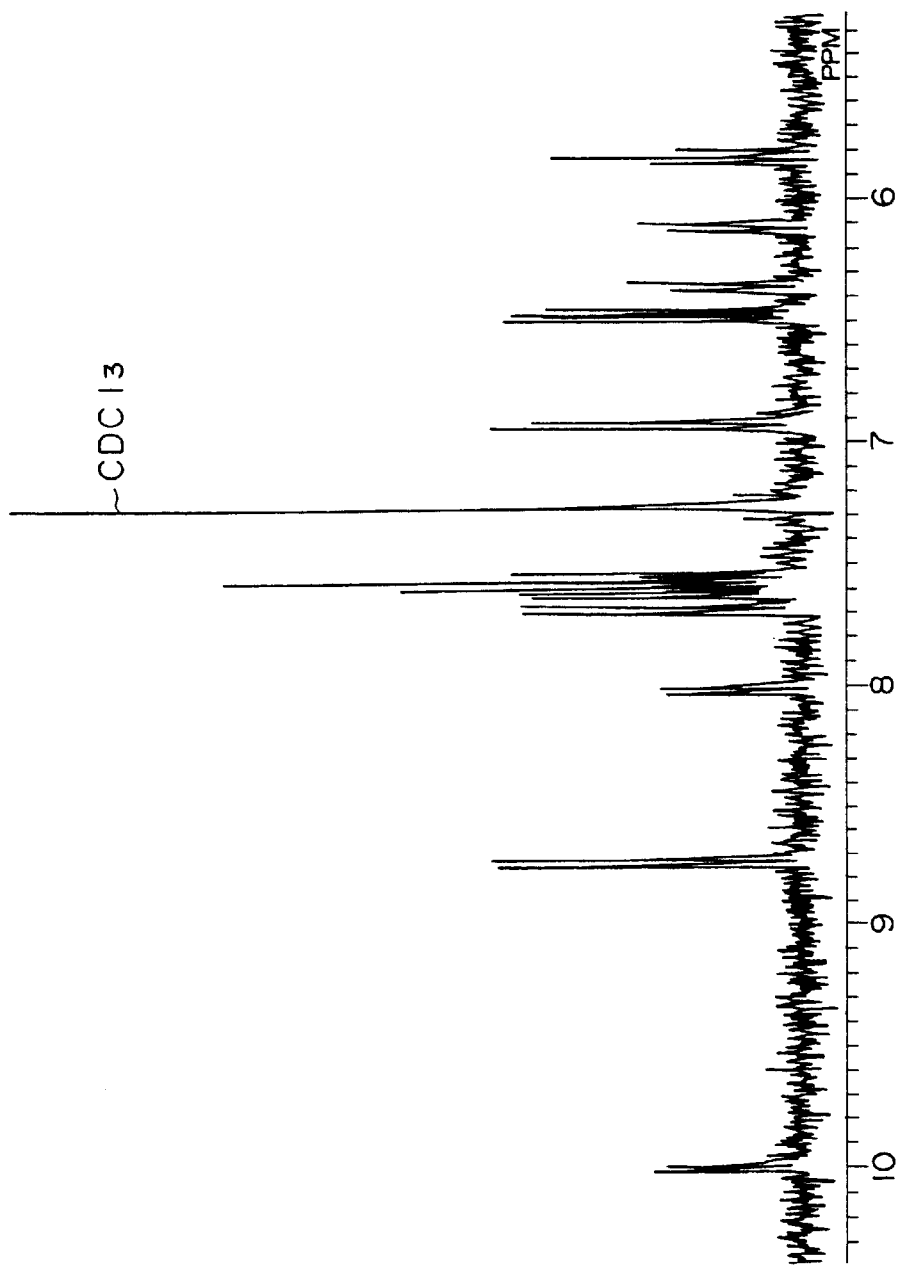
FIG. 21 is a proton-NMR spectrum chart of the zinc double-nuclear complex.

The $^1$H-NMR spectrum of the complex (in CDC13) is shown in FIG. 21.

Example 10

One example of applying the zinc double-nuclear complex $(Zn_2(B-O)_3)$ yielded in Example 8 to the organic EL device shown in FIG. 2 will now be described below.

By preparing films of a hole transfer agent TPD [N,N'-bis(3-methylphenyl)1,1'-biphenyl-4,'-diamine of the following formula (J)] and the zinc double-nuclear complex, individually at a film thickness of 500 angstroms, on a glass/ITO substrate by vacuum deposition, a hole transfer layer and a luminescent layer (also serving as an electron transfer layer) were sequentially formed thereon. As a metal electrode (negative electrode), furthermore, aluminium was laminated at a thickness of 500 angstroms thereon to generate an organic EL device.

Structural formula (J):

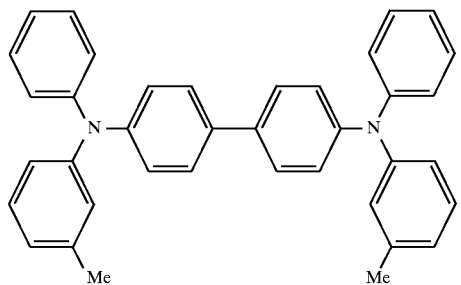

Figure 22:
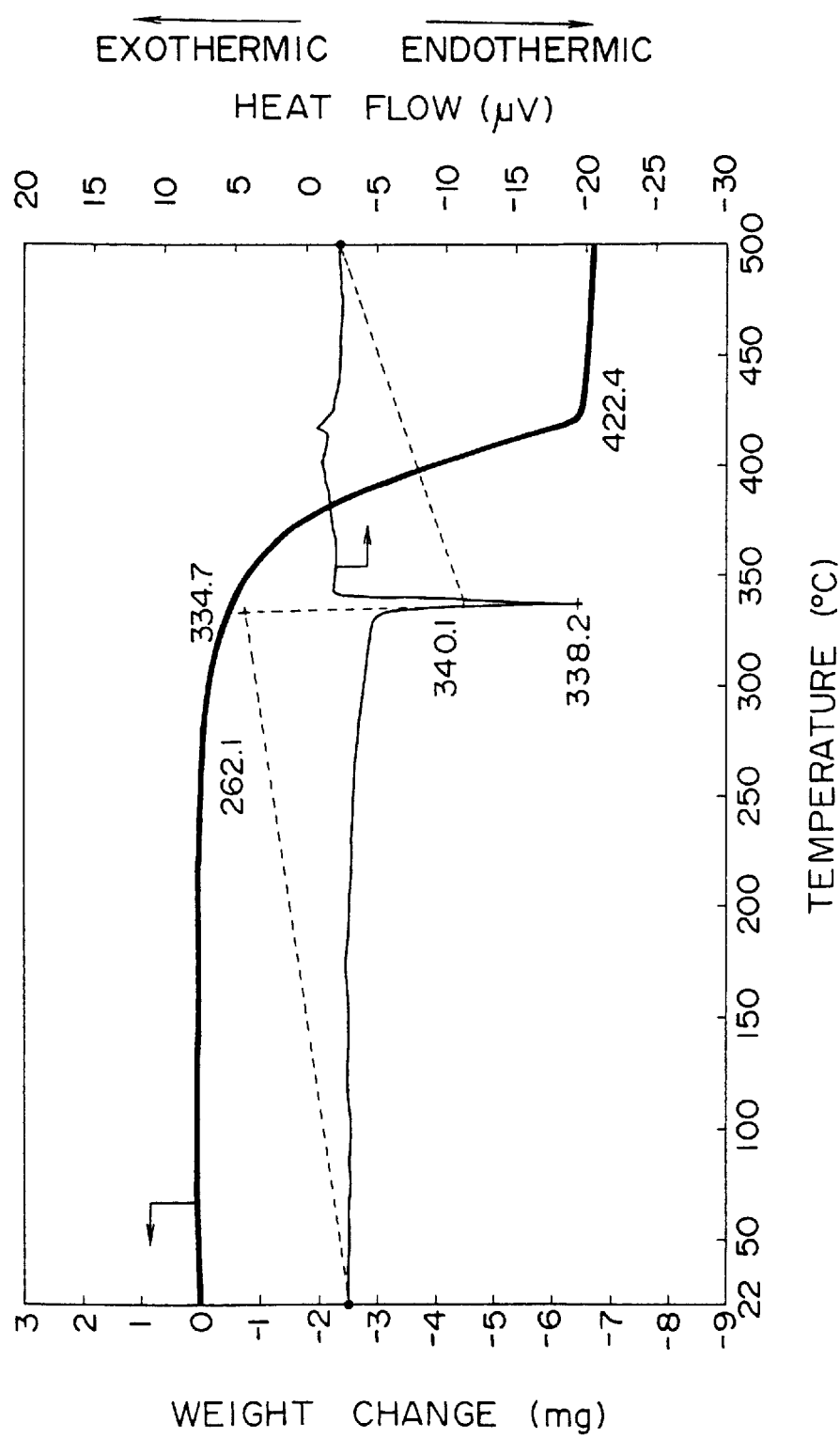
FIG. 22 is a DTA curve of the zinc double-nuclear complex of the present invention vs. the heating temperature.

The conditions for the vacuum deposition described above are as follows. FIG. 22 shows the DTA thermoanalysis spectrum of $Zn_2$ $(B-O)_3Cl$, which is not decomposed up to the melting point of 338.2° C. but starts to sublime and vaporize at a temperature slightly lower than the melting point.

Vacuum deposition rate:
- 2 to 4 angstroms/sec for TPD
- 2 to 4 angstroms/sec for the zinc complex
- 11 to 13 angstroms/sec for the negative electrode.

Vacuum degree: $2\times 10^{-6}$ Torr or less.

Figure 23:
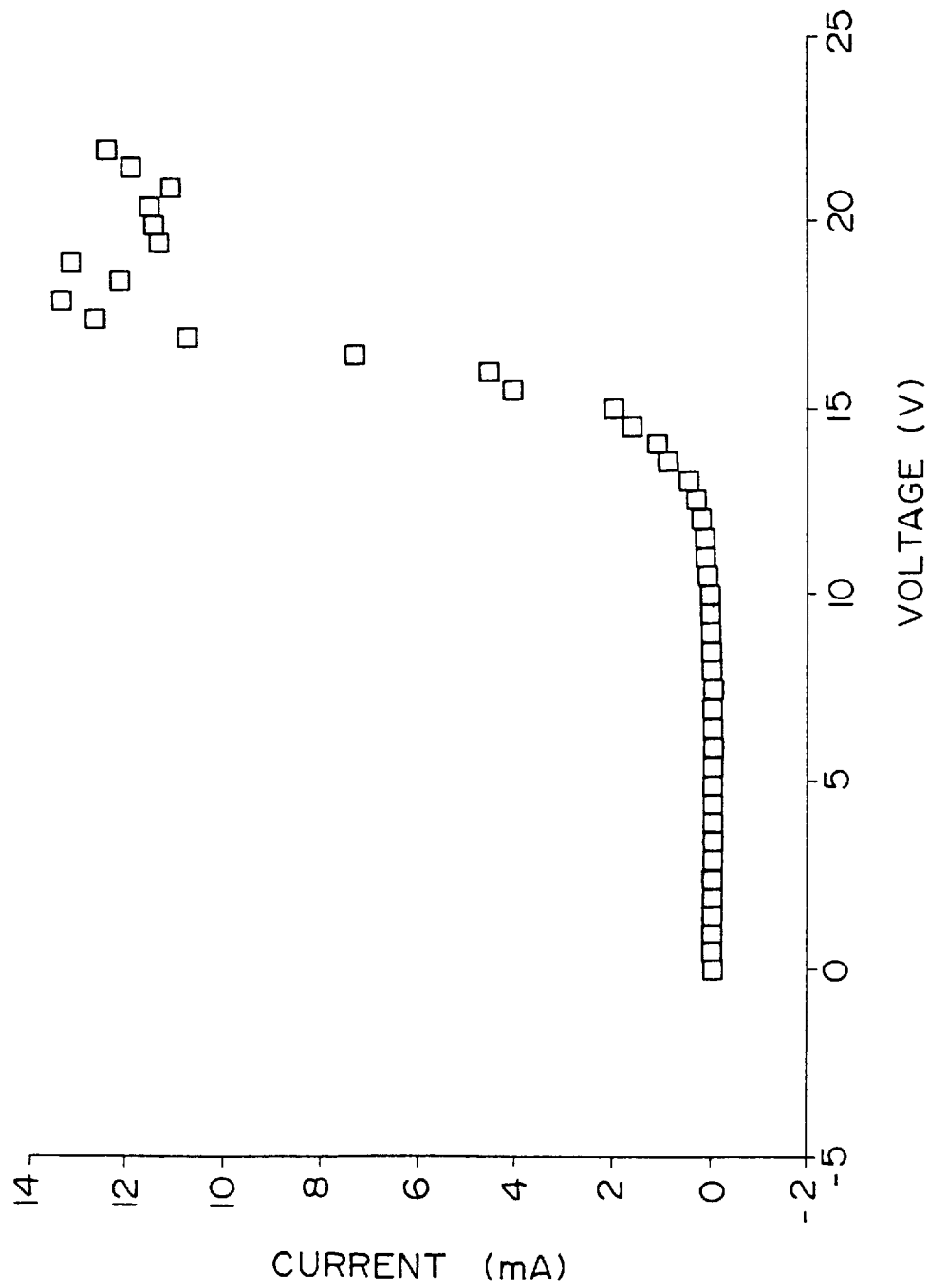
FIG. 23 is a current-voltage curve of an organic EL device of another example of the present invention.
Figure 24:
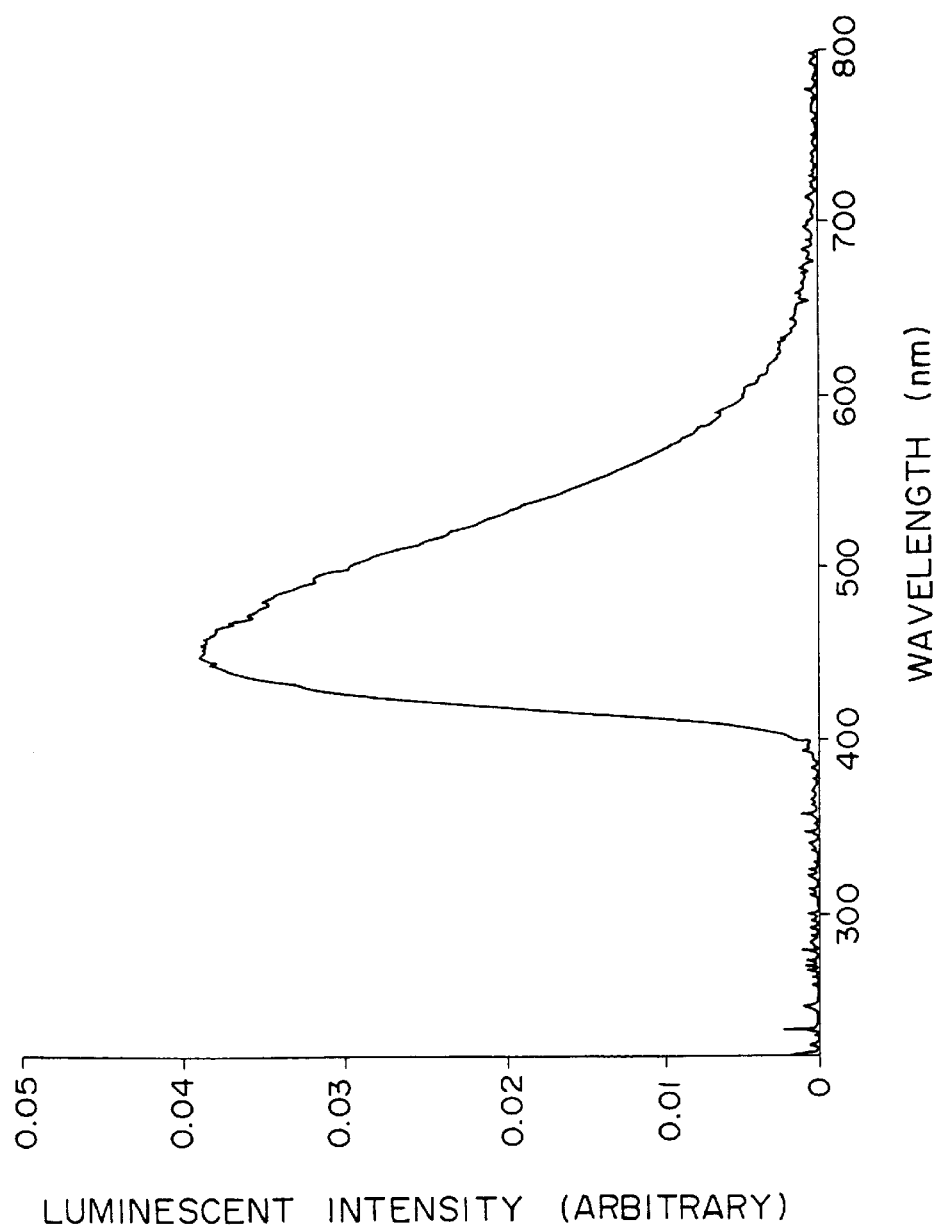
FIG. 24 is a luminescent spectrum chart of the organic EL device.

FIG. 23 depicts the current-voltage performance of the organic EL device prepared in the present Example. Electric current starts to flow at a voltage of 12 V, accompanied with blue luminescence. FIG. 24 depicts the emission spectrum from the EL device vs. the output ratio of a photoelectric multiplier at a voltage of 18 V (the same graphic representation is used below). The emission peak is at 460 nm, indicating that the peak wavelength resides in a region of short wavelength.

Example 11

Figure 25:
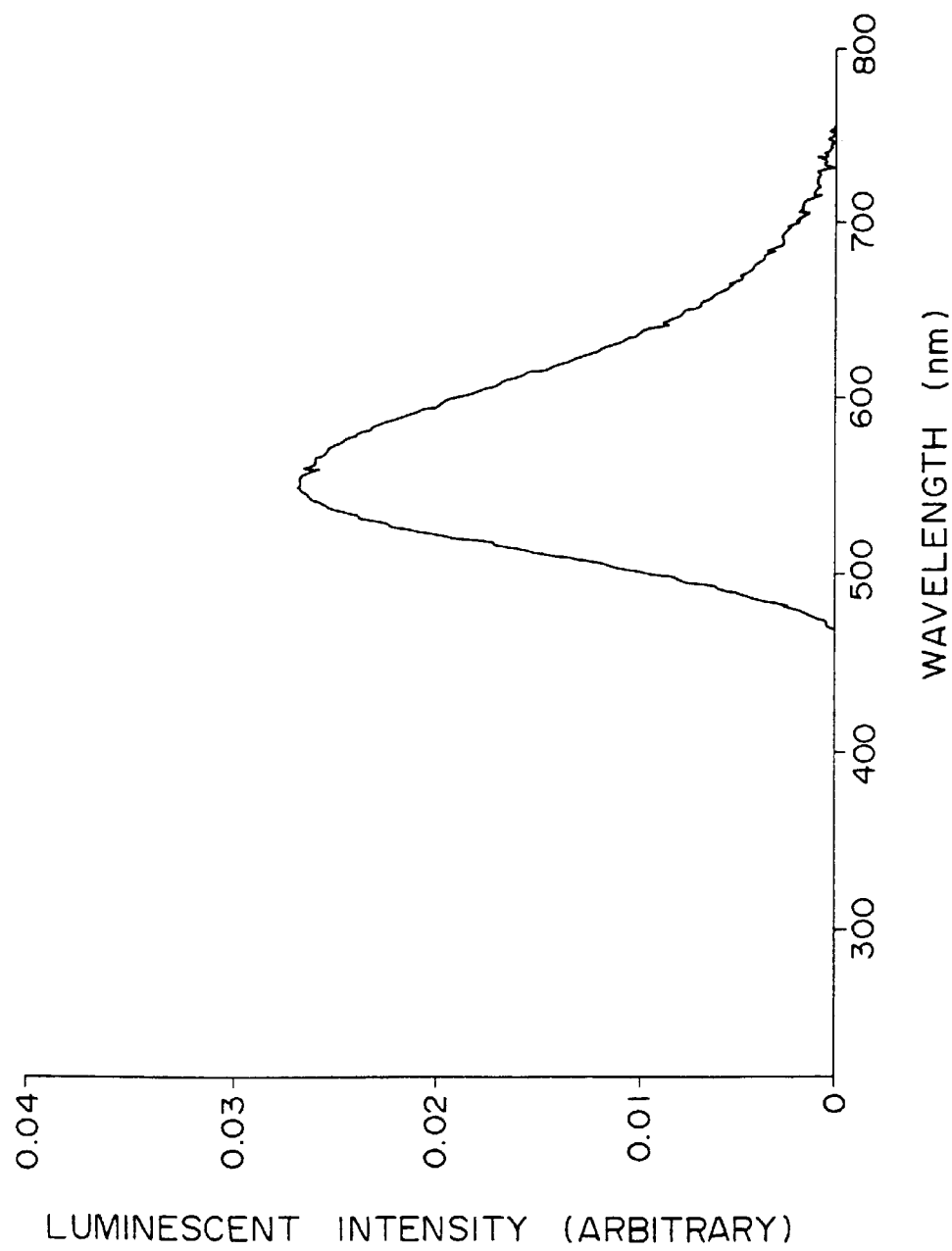
FIG. 25 is a luminescent spectrum chart of another organic EL device of the present invention.

The same procedures were repeated as in Example 3, except that the 8-quinolinol zinc double-nuclear complex prepared in Example 9 was used in place of $Zn_2$ $(B-O)_3$, to recover an organic EL device. FIG. 25 shows the emission spectrum from the EL device. The emission peak is at 550 nm, with luminescence of green.

Comparative Example 4

The same procedures were repeated as in Example 10 to prepare an organic EL device, except that the oxine complex [tris-(8-hydroxyquinoline) aluminium] reported in the conventional art described above was used in place of the substance of the luminescent layer (electron transfer layer) of the Example 10.

Figure 26:
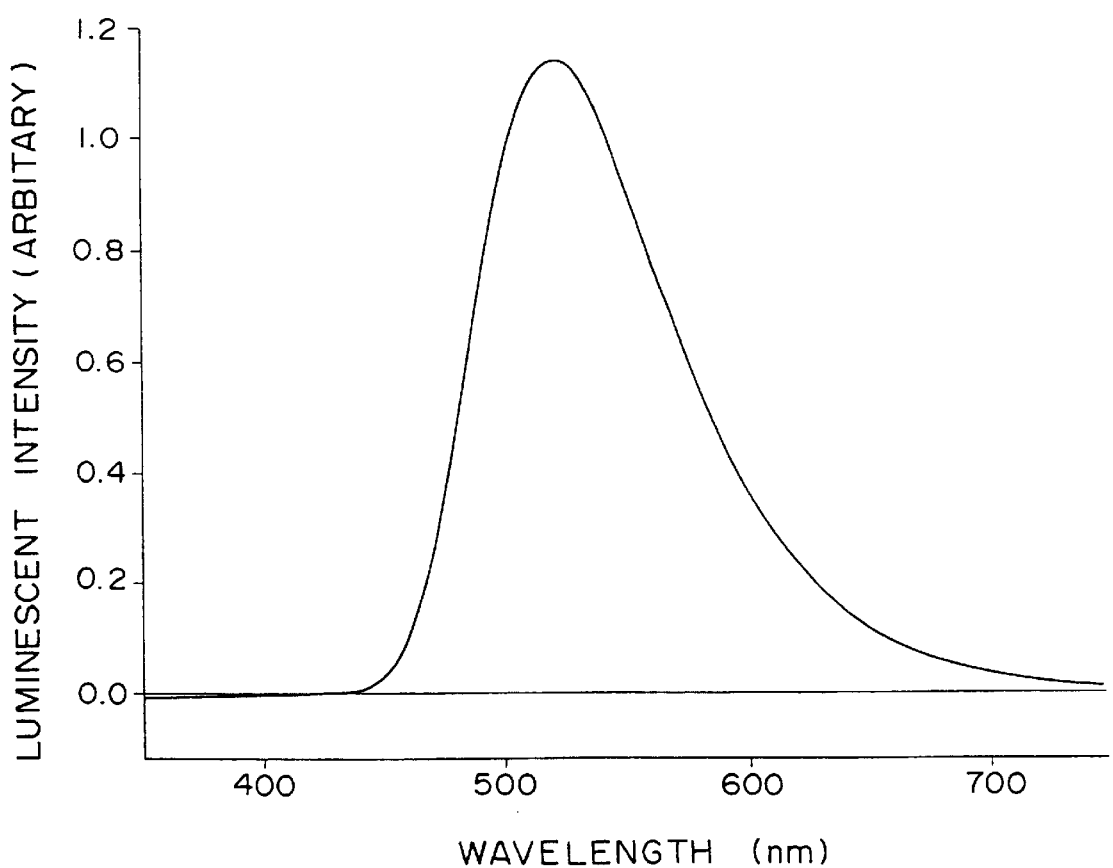
FIG. 26 is a luminescent spectrum chart of an organic EL device of a comparative example.

As shown in FIG. 26, the EL device has an emission peak at about 523 nm, with green luminescence. Thus, the peak wavelength is sift to a longer wavelength than that of Example 10.

Example 12

Zinc chloride (ZnC12:2.72 g), 2-(o-hydroxyphenyl)-benzoxazole [B-OH: 6.48 g (3/2-fold moles)] and 8-quinolinol [Q-OH: 4.35 g (3/2-fold moles)] were heated and melt together in ethanol (50 ml) prior to 10-min reflux. Aqueous ammonia (10 ml) was added dropwise to the mixture, and after the completion of the dropwise addition, reflux was continued for another 30 minutes.

After the completion of the reaction, hot alcohol was used to extract soluble matters, followed by addition of water for re-precipitation, and the resulting precipitate was filtered to recover solids. The solids were sequentially washed in water and ethanol, to recover a pale yellow solid. By purifying the solid by vacuum distillation, a zinc double-nuclear complex with mixed ligands was recovered.

Figure 27:
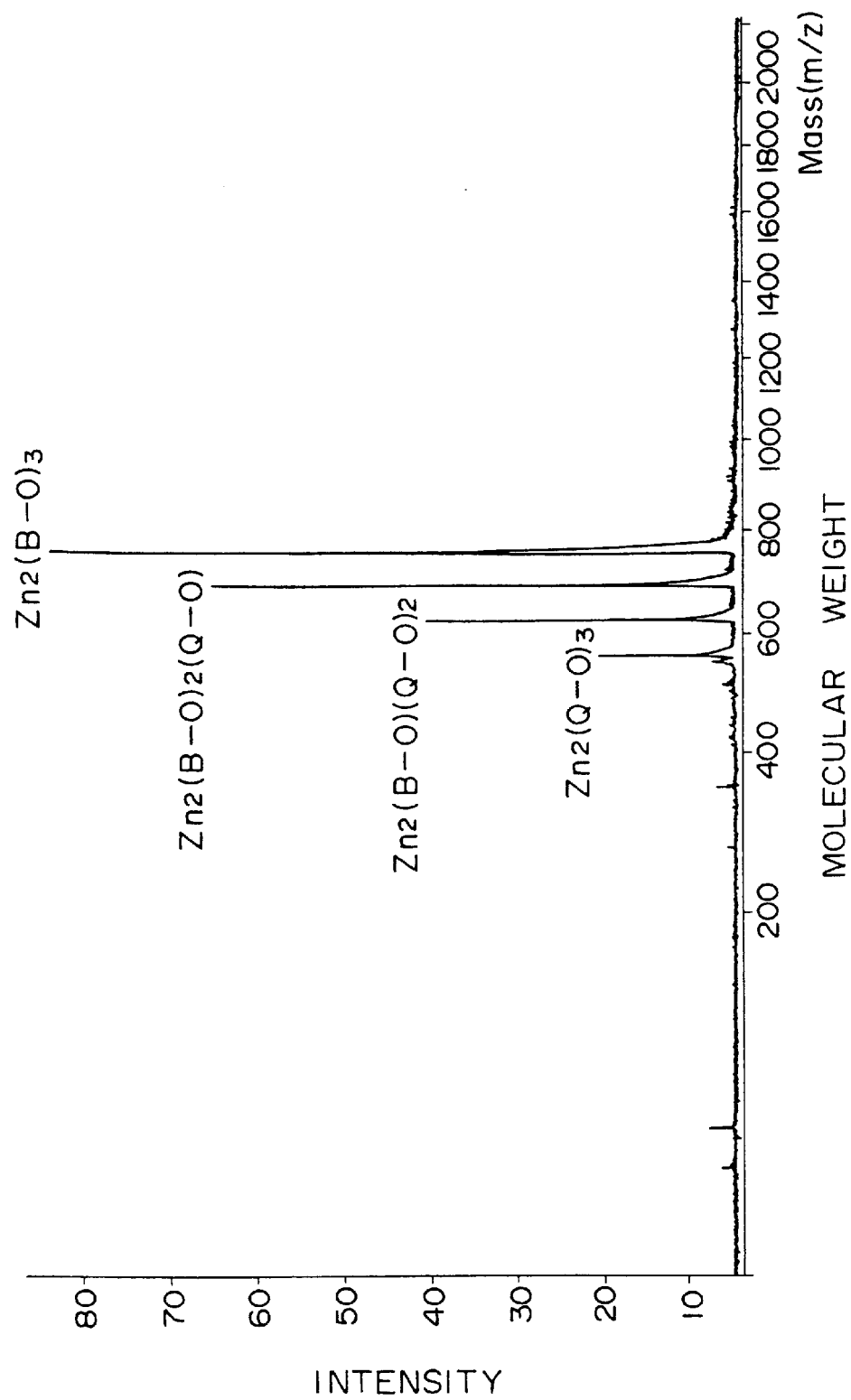
FIG. 27 is a mass-spectrum chart of a reaction mixture of still another example of the present invention.

FIG. 27 depicts the TOF mass-spectrum analysis of the reaction product within a molecular weight region of 0 to 2,000. The figure indicates the presence of parent peaks at molecular weights of 758 [Zn2 (B-O)3], 692 [Zn2 (B-O)$_2$ (Q-O)], 626 [Zn$_2$ (B-O)(Q-O)], and 560 [Zn$_2$ (Q-O)3].

Figure 28:
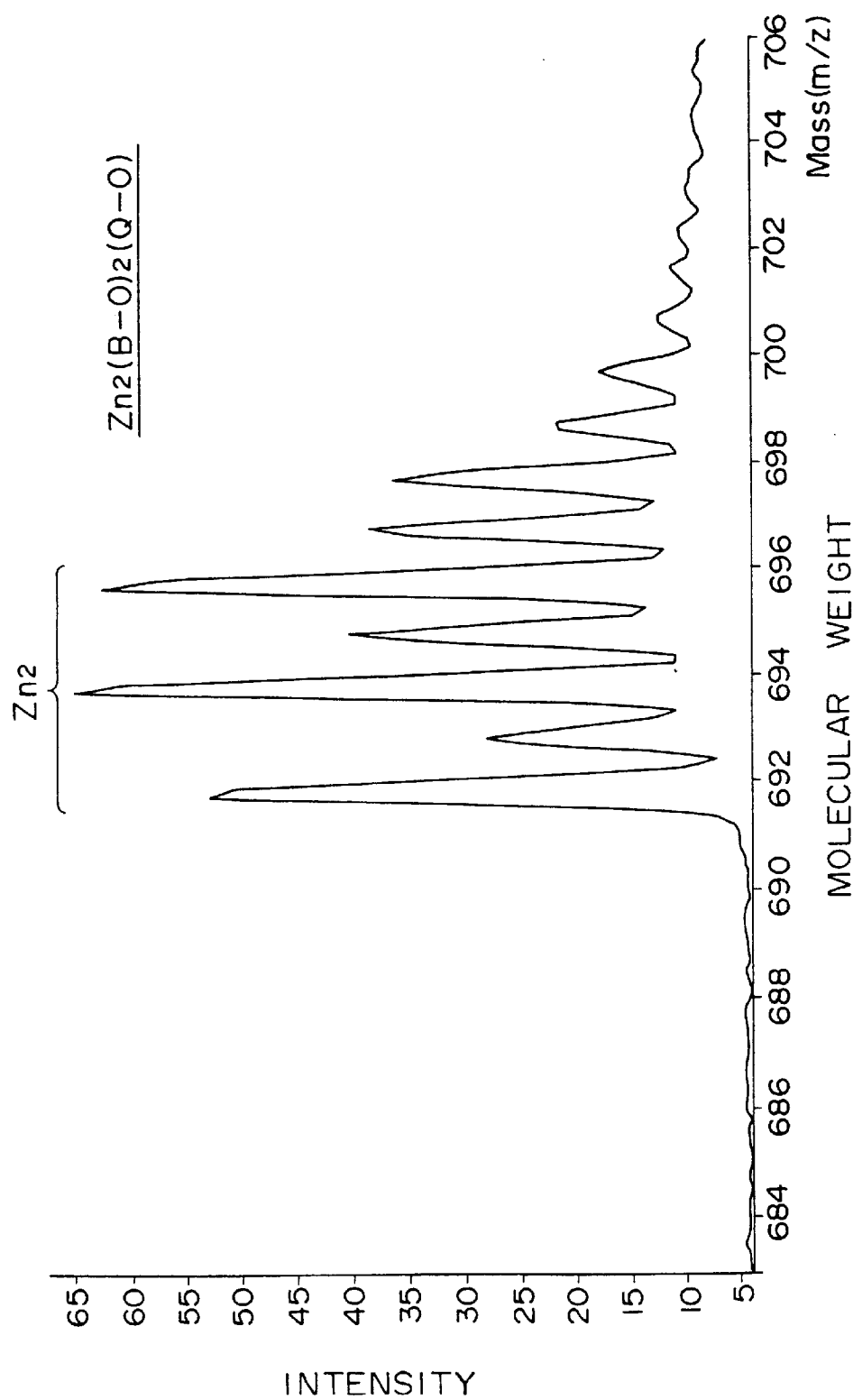
FIG. 28 is a mass-spectrum chart of an isolated $Zn_2(B-O)_2(Q-O)$.
Figure 29:
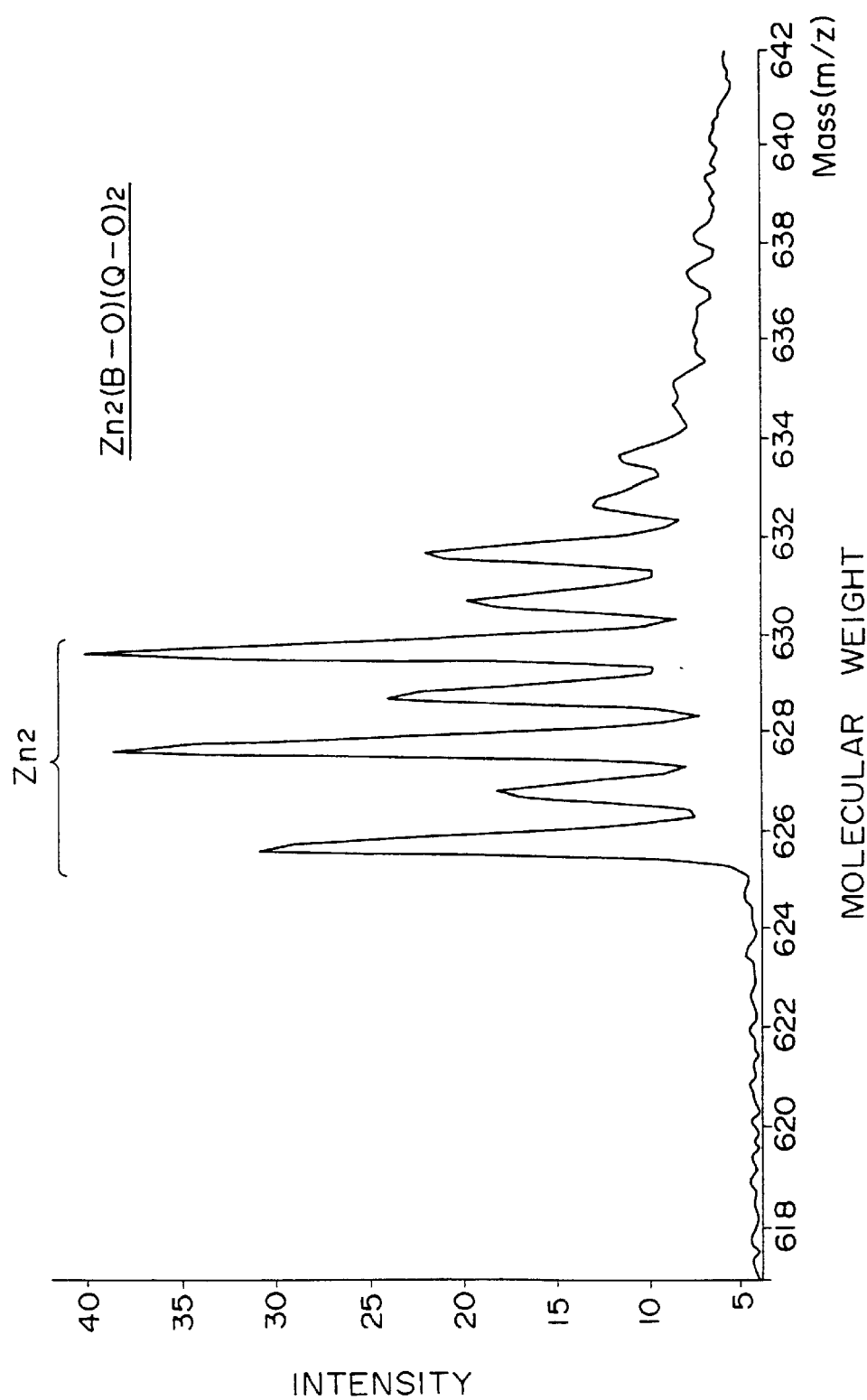
FIG. 29 is a mass-spectrum chart of an isolated $Zn_2(B-O)(Q-O)_2$.

FIG. 28 depicts the mass spectrum of the isolated Zn$_2$ (B-O)$_2$ (Q-O); and FIG. 29 depicts the mass spectrum of Zn$_2$ (B-O)(Q-O)$_2$.

In FIG. 28, a mass pattern (692, 694 and 696) corresponding to the ratio of zinc atoms with atomic weights of 64, 66, 68 and 70 is shown, while in FIG. 29, a mass spectrum pattern (626, 628 and 630) corresponding to zinc atomic weights is shown. Both the figures indicate that the products are zinc double-nuclear complexes with mixed ligands.

Example 13

Adding 1-hydroxyphenazine (5.88 g; 3/2-fold moles) to the raw materials of Example 12 and repeating the same procedures as in the Example, a zinc double-nuclear complex (yellow solid) with three types of mixed ligands was yielded.

Example 14

Aluminium chloride (1.33 g) and 2-(o-hydroxyphenyl)-benzoxazole [referred to as "B-OH": 4.22 g (2-fold moles)] were heated and melt together in ethanol (50 ml) prior to 10-min reflux. Aqueous ammonia (10 ml) was added dropwise to the mixture, and after the completion of the dropwise addition, reflux was continued for another 30 minutes.

After the completion of the reaction, the resulting mixture was left to stand. By filtration, solids were collected. The solids were sequentially washed in water and ethanol, to recover a pale yellow solid. By purifying the solid by vacuum distillation, an aluminium complex (1.2 g) was recovered.

Figure 30:
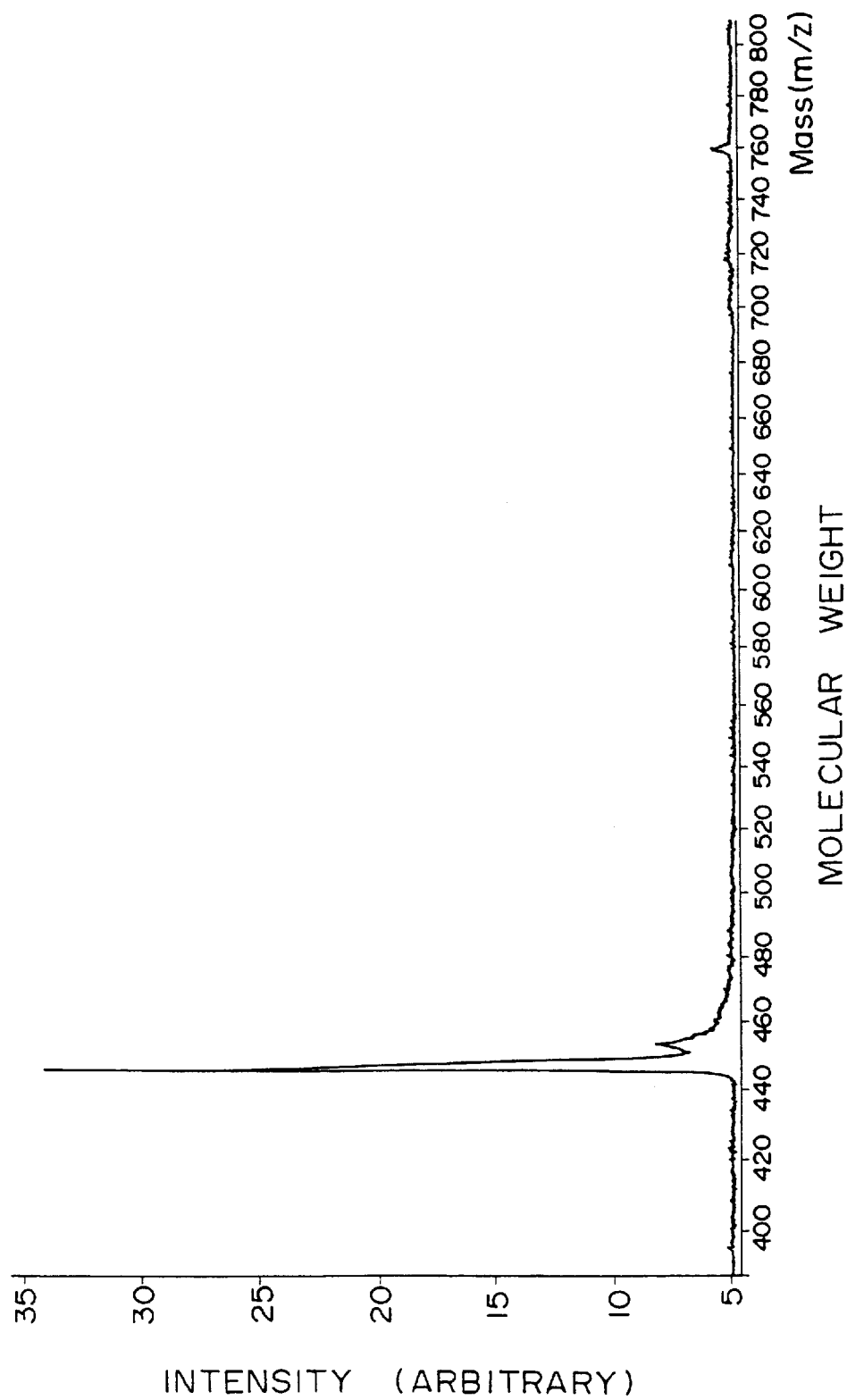
FIG. 30 is a mass-spectrum chart of an aluminium complex of an example of the present invention.
Figure 32:
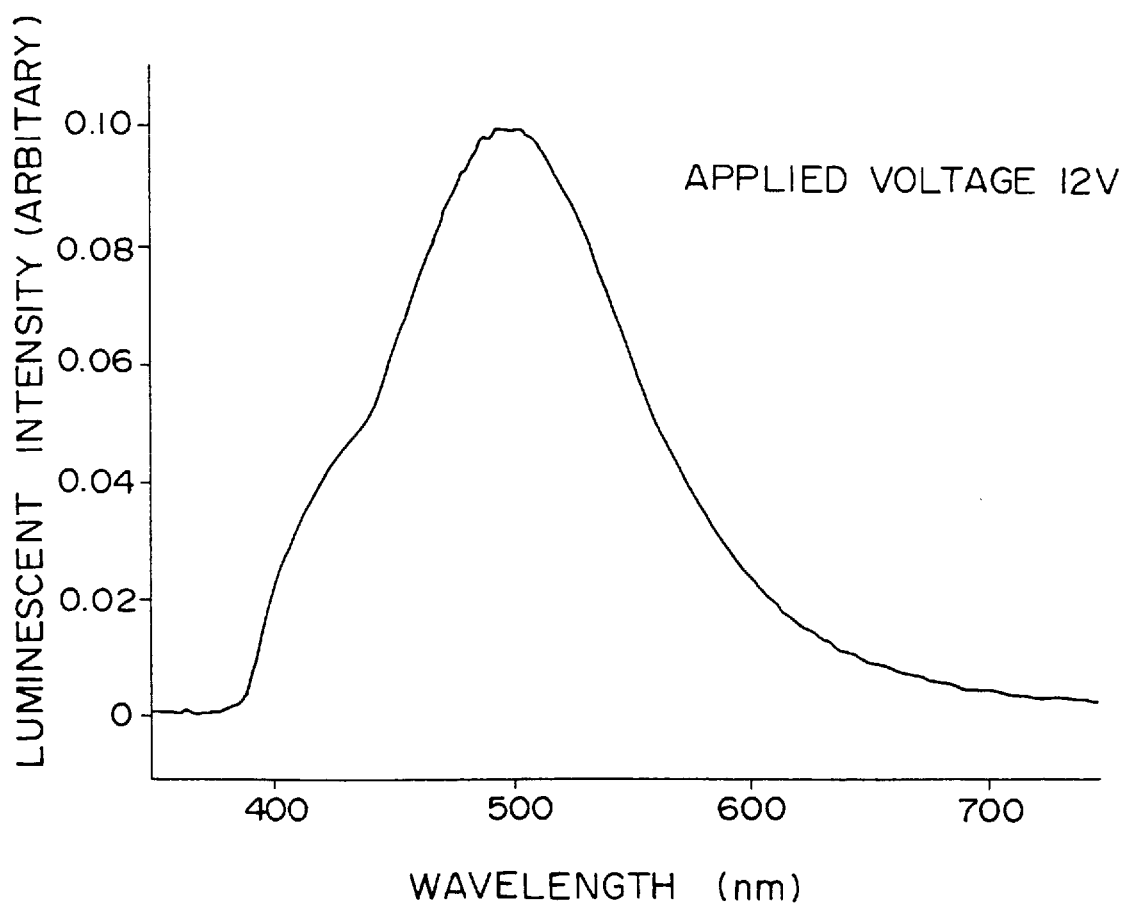
FIG. 32 is a luminescent spectrum chart of the organic EL device at a voltage of 12 V.
Figure 33:
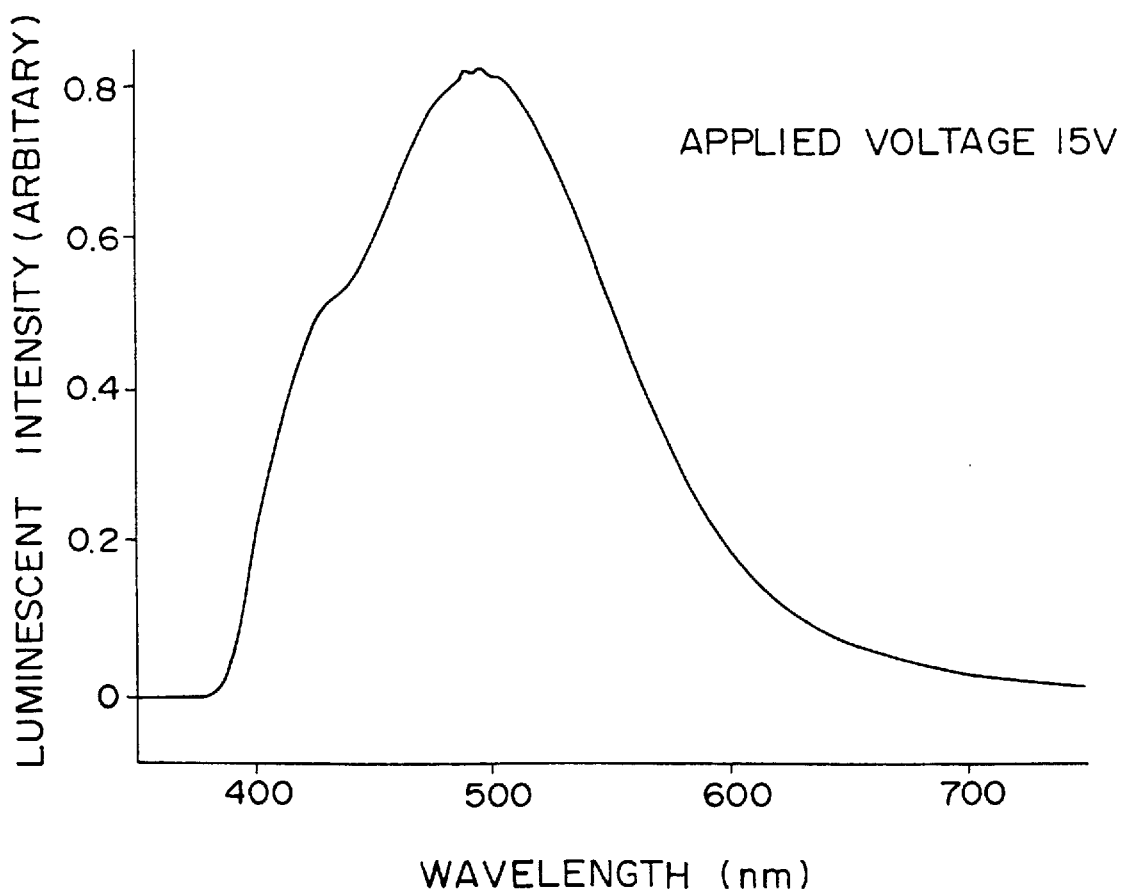
FIG. 33 is a luminescent spectrum chart of the organic EL device at a voltage of 15 V.
Figure 34:
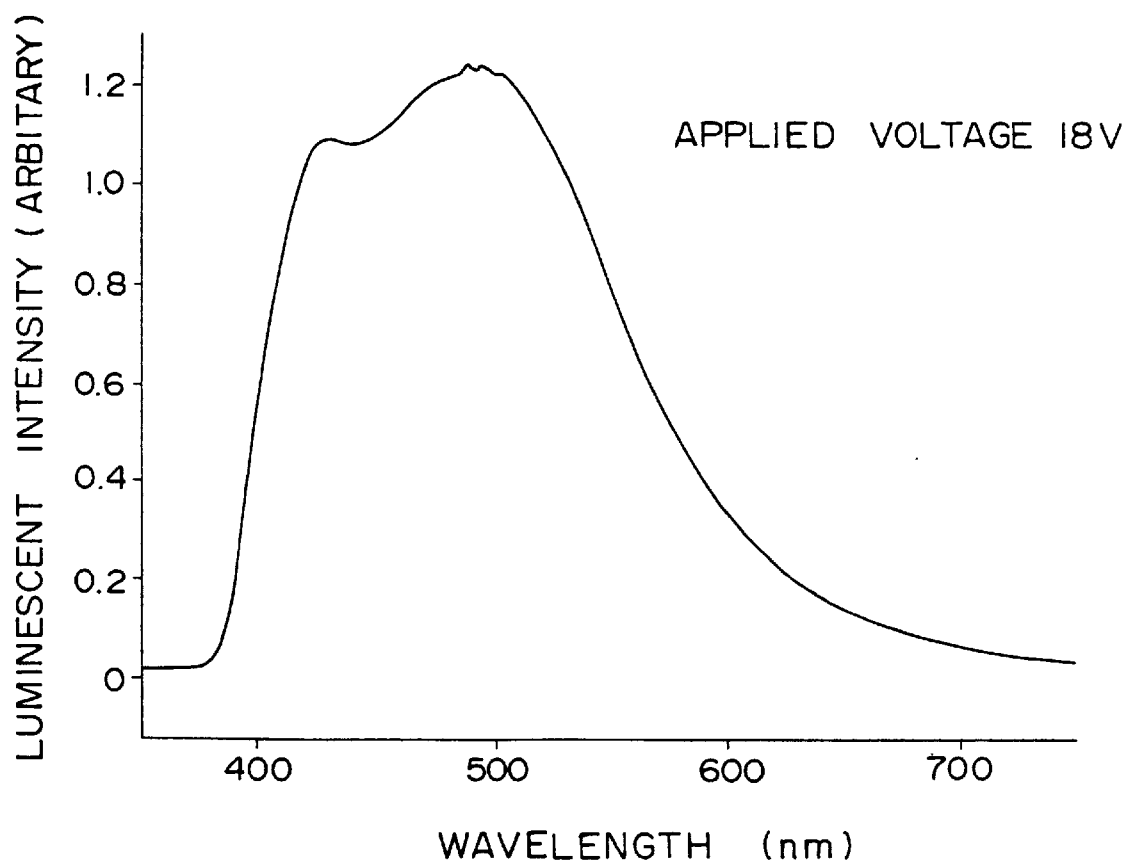
FIG. 34 is a luminescent spectrum chart of the organic EL device at a voltage of 18 V.

FIG. 30 depicts the TOF mass-spectrum analysis of the reaction product within a molecular weight region of 400 to 800 (by an analyzer of Type Vision 2000 manufactured by Finnigan Mat Co. Ltd.).

FIG. 30 indicates the presence of a parent peak at a molecular weight of 445 corresponding to Al(B-O)2. A halogen (chloride) and alcohol (ethanol) were detected as the pairing anions.

Using the material, an organic EL device having a configuration of ITO (transparent electrode) TPD (hole transfer layer)/aluminum complex (luminescent /layer)/Mg-Al (negative electrode) was prepared, as shown in FIG. 2, by vapor deposition. The film thickness of the TPD was 50 nm, and that of the aluminium complex was also 50 nm. Herein, TPD [N,N'-bis(3-methylphenyl)1,1'biphenyl-4,4'-diamine] is represented by the following formula (K).

Structural formula (K):

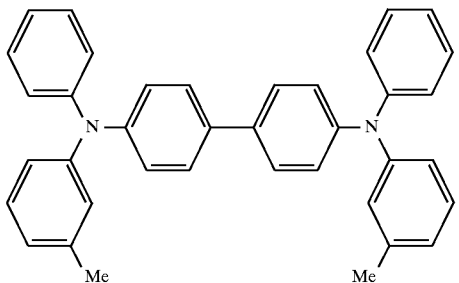

The conditions for the vacuum deposition described above are as follows.
Vacuum deposition rate:
  2 to 4 angstroms/sec for TPD
  2 to 4 angstroms/sec for the magnesium complex
  11 to 13 angstroms/sec for the negative electrode.
Vacuum degree: $2 \times 10^{-6}$ Torr or less.

FIGS. 31 to 34 show the emission spectrum of the EL device. In these figures, luminescence of blue green at 500 nm was observed at voltages of 9 V (FIG. 31) and 12 V (FIG. 32), which indicates that luminescence from the aluminium complex layer (luminescent layer) occurred. As the voltage increased to 15 V (FIG. 33) and 18 V (FIG. 34), luminescence of purple-like blue at 430 nm was additionally observed (a mixed color at the two principal wavelengths was overall observed), which indicates that the hole-electron reunion occurred in the TPD as the hole transfer layer, suggesting that the electron transfer potency of the aluminium complex was high.

Example 15

Aluminium chloride (1.33 g) and 8-quinolinol [referred to as "Q-OH": 2.90 g(2-fold moles)] were heated and melt together in ethanol (50 ml) prior to 10-min reflux. Aqueous ammonia (10 ml) was added dropwise to the mixture, and after the completion of the dropwise addition, reflux was continued for another 30 minutes.

After the completion of the reaction, the resulting mixture was left to stand. By filtration, solids were recovered. The solids were washed sequentially in water and ethanol, to recover a yellow solid. By purifying the solid by vacuum distillation, an aluminium complex (1.8 g) was recovered.

The TOF mass-spectrum analysis indicates the presence of a parent peak at a molecular weight corresponding to $Al(Q-O)_2$. Also, a halogen (chloride) and alcohol (ethanol) were detected as the pairing anions.

Using the material, an organic EL device having a configuration of ITO (transparent electrode) TPD (hole transfer layer)/aluminum complex (luminescent /layer)/Mg-Al (negative electrode) was prepared, as in Example 1, by vapor deposition. The luminescent spectrum of the EL device indicates that the luminescent color changes as the change of the voltage as described in Example 14.

Comparative Example 5

The same procedures were repeated as in Example 14 to prepare an organic EL device, except that the oxine complex [tris-(8-hydroxyquinoline) aluminium] reported in the conventional art described above was used in place of the substance of the luminescent layer (electron transfer layer) of the Example 14.

Figure 35:
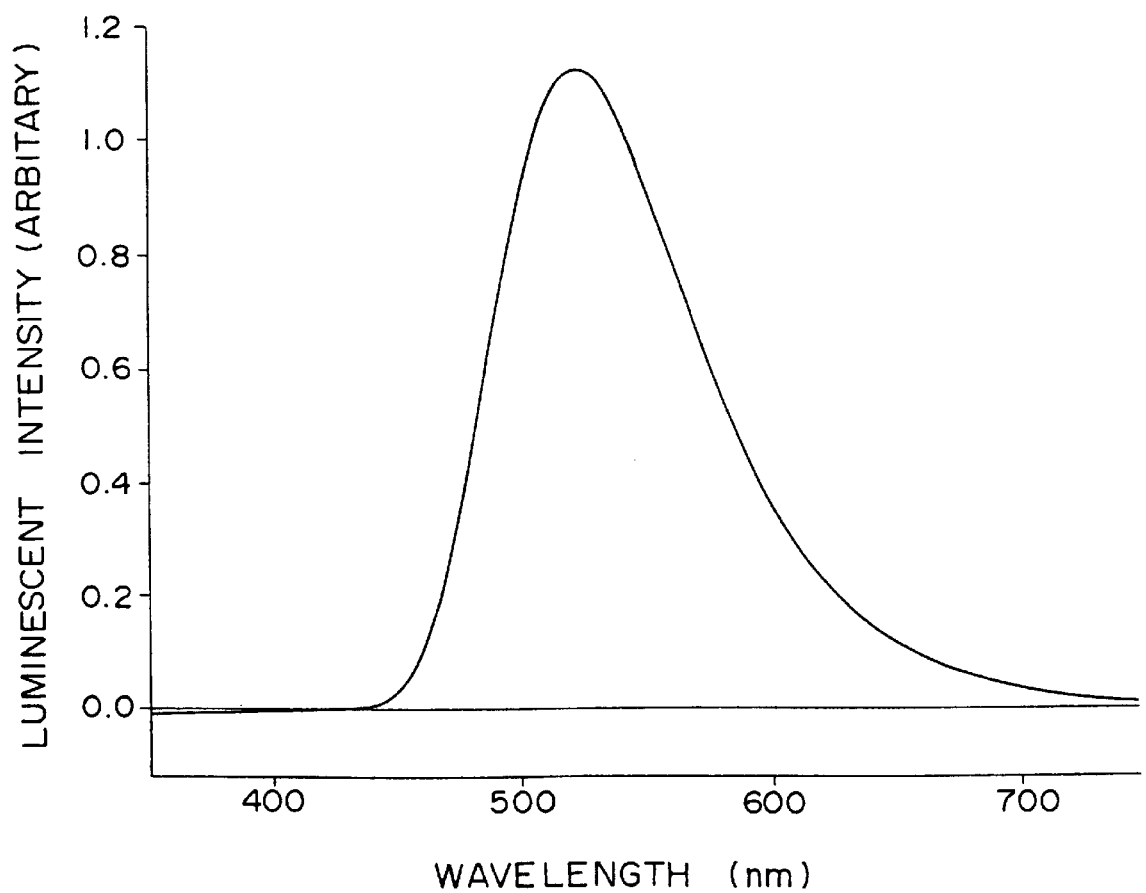
FIG. 35 is a luminescent spectrum chart of an organic EL device of a comparative example.

As shown in FIG. 35, the EL device has an emission peak at about 523 nm, with green luminescence. Thus, the peak wavelength is sift to a longer wavelength than that of Example 14. Only a single spectrum can be yielded from the device.

What is claimed is:
1. A bi-nuclear metal complex comprising:
  a bi-nuclear metal complex having the formula:

$$M_2(L^1\text{-O})_m(L^2\text{-O})_n(L^3\text{-O})_{3-m-n}Xp, \quad (I)$$

wherein M is a metal selected from the group consisting of Be, Mg, Ca, Sr, Ba, Ra, Zn, Cd and Hg; X is a halogen or an anion capable of pairing with an alkoxyl group or a phenoxyl group, m and n are, independently, integers of from 0 to 3, p is an integer of from 0 to 4; $L^1$, $L^2$ and $L^3$ are ligands individually different from each other and each is a ligand derived from a compound having a hydroxyl group and an aromatic nitrogen atom within the compound represented by the formulas:

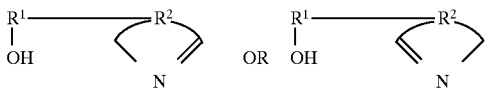

wherein $R^1$ and $R^2$ are independently a group or an atomic group; $R^1$ may form a ring in cooperation with an atom adjacent to the aromatic nitrogen atom and/or a part of $R^2$; and $R^2$ together with the aromatic nitrogen atom and/or an atom adjacent to the nitrogen atom forms a ring.

2. A bi-nuclear metal complex as defined in claim 1, wherein M is Mg.
3. A bi-nuclear metal complex as defined in claim 1, wherein M is Cd.
4. A bi-nuclear metal complex as defined in claim 1, wherein M is Zn.
5. A bi-nuclear metal complex as defined in claim 1, wherein $L^1$ is 2-o-hydroxyphenylbenzoxazole or a derivative thereof.
6. A bi-nuclear metal complex as defined in claim 5, wherein $L^2$ is 8-hydroxyquinoline or a derivative thereof.
7. A bi-nuclear metal complex as defined in claim 6, wherein $L^3$ is 1-hydroxyphenazine or a derivative thereof.
8. A bi-nuclear metal complex as defined in claim 5, wherein $L^3$ is 1-hydroxyphenazine or a derivative thereof.
9. A bi-nuclear metal complex as defined in claim 1, wherein $L^2$ is 8-hydroxyquinoline or a derivative thereof.
10. A bi-nuclear metal complex as defined in claim 1, wherein $L^3$ is 1-hydroxyphenazine or a derivative thereof.
11. A bi-nuclear metal complex according to claim 1, wherein the ligand L1 may be o-hydroxyphenylbenzoxazole represented by the following structural formula (B) or a derivative thereof; and the ligand L2 may be 8-hydroxyquinoline represented by the following structural formula (C) and a derivative thereof:

Structural formula (B):

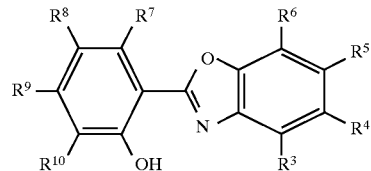

(wherein $R^3$, $R^4$, $R^5$, $R^6$, $R^7$, $R^8$, $R^9$ and $R^{10}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different)

Structural formula (C):

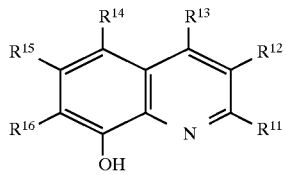

(wherein $R^{11}$, $R^{12}$, $R^{13}$, $R^{14}$, $R^{15}$, and $R^{16}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.).

12. A method for making a bi-nuclear metal complex of the formula:

$$M_2(L^1\text{-O})_m(L^2\text{-O})_n(L^3\text{-O})_{3-m-n}Xp, \qquad (I)$$

wherein M is a metal selected from the group consisting of Be, Mg, Ca, Sr, Ba, Ra, Zn, Cd and Hg; X is a halogen or an anion capable of pairing with an alkoxyl group or a phenoxyl group, m and n are, independently, integers of from 0 to 3, p is an integer of from 0 to 4; $L^1$, $L^2$ and $L^3$ are ligands individually different from each other and each is a ligand derived from a compound having a hydroxyl group and an aromatic nitrogen atom within the compound represented by the formulas:

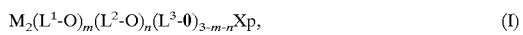

wherein $R^1$ and $R^2$ are independently a group or an atomic group; $R^1$ may form a ring in cooperation with an atom adjacent to the aromatic nitrogen atom and/or a part of $R^2$; and $R^2$ together with the aromatic nitrogen atom and/or an atom adjacent to the nitrogen atom forms a ring, said method comprising the steps of:

reacting a metal salt having the formula:
$M_nX'_2$, wherein M is a metal as defined above and X' is the same as X defined above; with at least one compound selected from the group consisting of $L^1OH$, $L^2OH$, $L^3OH$ and mixtures of any of the foregoing, wherein $L^1$, $L^2$ and $L^3$ are the same as defined above, in a $C_1$-$C_{12}$ alcohol solvent.

13. A method according to claim 12, wherein an alkali is added for the reaction to eliminate the hydrogen atom of the compound represented by the general formula (III).

14. A method according to claim 12, wherein the ligand $L^1$ may be o-hydroxyphenylbenzoxazole represented by the following structural formula (B) or a derivative thereof; and the ligand L2 may be 8-hydroxyquinoline represented by the following structural formula (C) and a derivative thereof:

Structural formula (B):

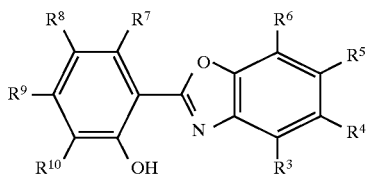

(wherein $R^3$, $R^4$, $R^5$, $R^6$, $R^7$, $R^8$, $R^9$ and $R^{10}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different)

Structural formula (C):

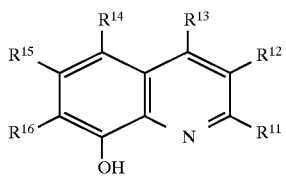

(wherein $R^{11}$, $R^{12}$, $R^{13}$, $R^{14}$, $R^{15}$, and $R^{16}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.).

15. An optical device comprising a luminescent layer and/or an electron transfer layer, said luminescent layer and said electron transfer layer comprising a bi-nuclear metal complex of the formula $$M_2(L^1\text{-O})_m(L^2\text{-O})_n(L^3\text{-O})_{3-m-n}Xp, \qquad (I)$$

wherein M is a metal selected from the group consisting of Be, Mg, Ca, Sr, Ba, Ra, Zn, Cd and Hg; X is a halogen or an anion capable of pairing with an alkoxyl group or a phenoxyl group, m and n are, independently, integers of from 0 to 3, p is an integer of from 0 to 4; $L^1$, $L^2$ and $L^3$ are ligands individually different from each other and each is a ligand derived from a compound having a hydroxyl group and an aromatic nitrogen atom within the compound represented by the formulas:

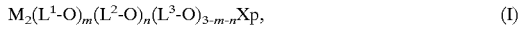

wherein $R^1$ and $R^2$ are independently a group or an atomic group; $R^1$ may form a ring in cooperation with an atom adjacent to the aromatic nitrogen atom and/or a part of $R^2$; and $R^2$ together with the aromatic nitrogen atom and/or an atom adjacent to the nitrogen atom forms a ring.

16. An optical device according to claim 15, wherein the ligand $L^1$ may be o-hydroxyphenylbenzoxazole represented by the following structural formula (B) or a derivative thereof; and the ligand $L^2$ may be 8-hydroxyquinoline represented by the following structural formula (C) and a derivative thereof:

Structural formula (B):

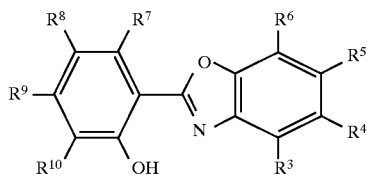

(wherein $R^3$, $R^4$, $R^5$, $R^6$, $R^7$, $R^8$, $R^9$ and $R^{10}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different)

Structural formula (C):

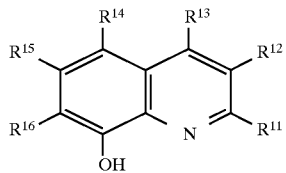

(wherein $R^{11}$, $R^{12}$, $R^{13}$, $R^{14}$, $R^{15}$, and $R^{16}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.).

17. An optical device according to claim 15, containing a single type of a bi-nuclear metal complex or plural types of bi-nuclear metal complexes.

18. An optical device according to claim 17, containing a fluorescent dye together with a bi-nuclear metal complex.

19. An optical device according to claim 15, wherein a transparent electrode, a hole transfer layer, a luminescent layer and/or an electron transfer layer, and a negative electrode ate laminated sequentially in this order on a substrate.

20. An optical device according to claim 19, which is constructed as an electroluminescent device.

21. An optical device comprising a luminescent layer and an electron transfer layer, said luminescent layer and said electron transfer layer comprising an aluminum complex having the formula:

Al(L-O)$_2$X, wherein X is a halogen or an anion capable of pairing with an alkoxyl group or a phenoxyl group, and L is a ligand derived from a compound containing a hydroxyl group and an aromatic nitrogen atom within the compound, wherein the hydrogen atom of the hydroxyl group is eliminated from the compound and having the formula:

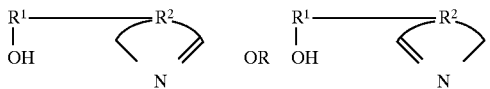

wherein $R^1$ and $R^2$ are independently a group or an atomic group; $R^1$ may form a ring in cooperation with an atom adjacent to the aromatic nitrogen atom and/or a part of $R^2$; and $R^2$ together with the aromatic nitrogen atom and/or an atom adjacent to the nitrogen atom forms a ring.

22. An optical device according to claim 21, wherein the ligand L may be o-hydroxyphenylbenzoxazole represented by the following structural formula (E) or a derivative thereof:

Structural formula (E):

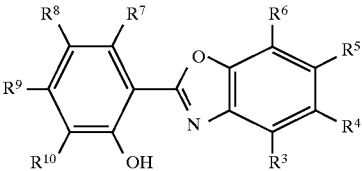

(wherein $R^3$, $R^4$, $R^5$, $R^6$, $R^7$, $R^8$, $R^9$ and $R^{10}$ are independently selected from the group consisting of hydrogen atom, a halogen atom, hydroxyl group, nitro group, carboxyl group, carbonyl group, amino group, amide group, sulfonate group, and an alkyl group, an aryl group and a heterocyclic aromatic group, all being substituted or unsubstituted with these atoms or groups; they may be the same or different.).

23. An optical device according to claim 22, containing a single type of an aluminium double-nuclear complex or plural types of aluminium double-nuclear complexes.

24. An optical device according to claim 23, containing a fluorescent dye together with an aluminium double-nuclear complex.

25. An optical device according to claim 21, wherein a transparent electrode, a hole transfer layer, a luminescent layer and/or an electron transfer layer, and a negative electrode are laminated sequentially in this order on a substrate.

26. An optical device according to claim 25, which is constructed as an electroluminescent device.

* * * * *